(12) United States Patent
Okunishi et al.

(10) Patent No.: US 10,096,454 B2
(45) Date of Patent: *Oct. 9, 2018

(54) PLASMA PROCESSING APPARATUS

(71) Applicant: TOKYO ELECTRON LIMITED, Tokyo (JP)

(72) Inventors: Naohiko Okunishi, Miyagi (JP); Nozomu Nagashima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 691 days.

This patent is subject to a terminal disclaimer.

(21) Appl. No.: 14/643,667

(22) Filed: Mar. 10, 2015

(65) Prior Publication Data

US 2015/0262793 A1 Sep. 17, 2015

(30) Foreign Application Priority Data

Mar. 11, 2014 (JP) ................................. 2014-047963

(51) Int. Cl.
*H01J 37/32* (2006.01)
*H01L 21/67* (2006.01)
(Continued)

(52) U.S. Cl.
CPC .. *H01J 37/32284* (2013.01); *H01J 37/32082* (2013.01); *H01J 37/32155* (2013.01); *H01J 37/32174* (2013.01); *H01J 37/32192* (2013.01); *H01J 37/32256* (2013.01); *H01L 21/67069* (2013.01); *H01L 21/67248* (2013.01);
(Continued)

(58) Field of Classification Search
CPC ........... H01J 37/32284; H01J 37/32174; H01J 37/32155; H01J 37/32256; H03H 1/0007; H01R 13/719
See application file for complete search history.

(56) References Cited

U.S. PATENT DOCUMENTS 3,015,618 A * 1/1962 Stix ........................ G21B 1/055
313/161
5,477,975 A * 12/1995 Rice .................. H01J 37/32082
156/345.27
(Continued)

FOREIGN PATENT DOCUMENTS

JP 2011-135052 A 7/2011

*Primary Examiner* — Aiden Lee
(74) *Attorney, Agent, or Firm* — Brundidge & Stanger, P.C.

(57) ABSTRACT

A resonance frequency can be adjusted by shifting the resonance frequency without reducing an impedance function or a withstanding voltage characteristic against a high frequency noise, when blocking, by using a multiple parallel resonance characteristic of a distributed constant line, the high frequency noise introduced into a power feed line from an electrical member other than a high frequency electrode within a processing vessel. Comb teeth M of a comb-teeth member 114 are inserted into winding gaps of air core coils 104(1) and 104(2). For example, first comb teeth M– having a thickness m– smaller than a standard thickness ts are mainly inserted in an effective zone A in a central portion of the air core coils. Further, in non-effective zones B at both sides or both end portions thereof, second comb teeth M+ having a thickness m+ equal to or larger than the standard thickness ts are arranged.

10 Claims, 28 Drawing Sheets

(51) Int. Cl.
*H01L 21/683* (2006.01)
*H01R 13/719* (2011.01)
*H03H 1/00* (2006.01)

(52) U.S. Cl.
CPC ........ *H01L 21/6831* (2013.01); *H01R 13/719* (2013.01); *H03H 1/0007* (2013.01)

(56) References Cited

U.S. PATENT DOCUMENTS

| | | | | |
|---|---|---|---|---|
| 5,681,418 | A * | 10/1997 | Ishimaru | H01J 37/321 118/723 IR |
| 5,726,611 | A * | 3/1998 | Takagi | H01F 17/06 333/181 |
| 5,846,329 | A * | 12/1998 | Hori | H01J 37/321 118/723 E |
| 6,008,477 | A * | 12/1999 | Nakao | H01L 21/67109 219/390 |
| 6,308,654 | B1 * | 10/2001 | Schneider | H01J 37/321 118/723 I |
| 7,199,692 | B2 * | 4/2007 | Suzuki | H03H 7/427 336/170 |
| 8,031,824 | B2 * | 10/2011 | Bystriskii | G21B 1/052 376/107 |
| 9,530,619 | B2 * | 12/2016 | Okunishi | H03H 7/38 |
| 9,754,766 | B2 * | 9/2017 | Okunishi | H01J 37/32091 |
| 2007/0284344 | A1 * | 12/2007 | Todorov | H01J 37/32706 219/121.54 |
| 2008/0197780 | A1 * | 8/2008 | Yamazawa | H01J 37/32091 315/111.21 |
| 2009/0133839 | A1 * | 5/2009 | Yamazawa | H01J 37/32091 156/345.37 |
| 2011/0126765 | A1 * | 6/2011 | Yamazawa | H01J 37/32091 118/723 MW |
| 2012/0032756 | A1 * | 2/2012 | Long | H01J 37/32174 333/181 |

* cited by examiner

FIG. 22

| | POSITION OF WINDING GAP SATISFYING fnP ≤ fnP′(dB) | SHIFT AMOUNT OF PARALLEL RESONANCE FREQUENCY(MHz) | | | | | | SHIFT AMOUNT OF SERIAL RESONANCE FREQUENCY(MHz) | | | | | |
|---|---|---|---|---|---|---|---|---|---|---|---|---|---|
| | | f1P (9.70) | f2P (33.98) | f3P (57.98) | f4P (81.38) | f5P (105.78) | f6P (130.4) | f1S | f2S (31.00) | f3S (56.4) | f4S (80.38) | f5S (104.00) | f6S (129.44) |
| XBL1 | COMPARISON REFERENCE PAL | 0.0 | 0.0 | 0.0 | 0.0 | 0.0 | 0.0 | – | 0.0 | 0.0 | 0.0 | 0.0 | 0.0 |
| XBL2 | No.1~2 | 0.1 | 0.0 | -0.6 | -1.0 | -1.9 | -2.5 | – | -0.1 | -0.4 | -0.8 | -1.6 | -2.1 |
| XBL3 | No.3~4 | 0.1 | -0.3 | -0.9 | -0.5 | 0.2 | 1.5 | – | -0.3 | -0.5 | -0.1 | -0.8 | 1.8 |
| XBL4 | No.5~6 | 0.0 | -0.4 | -0.2 | 1.4 | 2.7 | 1.2 | – | -0.3 | 0.3 | 1.7 | 2.6 | 0.3 |
| XBL5 | No.7~8 | 0.0 | -0.3 | 0.8 | 2.0 | -1.5 | -4.3 | – | -0.1 | 1.1 | 1.8 | -2.1 | -3.4 |
| XBL6 | No.9~10 | 0.0 | -0.1 | 1.4 | -0.7 | -2.4 | 1.9 | – | 0.1 | 1.4 | -1.2 | -2.2 | 2.0 |
| XBL7 | No.11~12 | 0.0 | 0.2 | 0.8 | -2.1 | 1.5 | 0.8 | – | 0.4 | 0.5 | -2.0 | 1.7 | 0.5 |
| XBL8 | No.13~14 | 0.0 | 0.0 | -0.5 | -0.3 | 1.8 | -3.2 | – | 0.6 | -0.7 | -0.1 | 1.6 | -3.0 |
| XBL9 | No.15~16 | 0.0 | 0.7 | -1.3 | 2.0 | -2.5 | 2.5 | – | 0.7 | -1.3 | 2.1 | -2.6 | 2.7 |
| XBL10 | No.17~18 | 0.0 | 0.8 | -1.2 | 1.3 | -1.2 | 0.1 | – | 0.6 | -1.1 | 1.1 | -1.0 | -0.2 |
| XBL11 | No.19~20 | -0.1 | 0.7 | -0.3 | -1.1 | 2.8 | -3.1 | – | 0.5 | 0.0 | -1.3 | 2.8 | -3.1 |
| XBL12 | No.21~22 | -0.1 | 0.5 | 0.9 | -2.1 | 0.0 | 3.2 | – | 0.2 | 1.1 | -2.1 | -0.1 | 3.2 |
| XBL13 | No.23~24 | -0.1 | 0.2 | 0.3 | 0.1 | -3.1 | -0.3 | – | 0.0 | 1.4 | 0.2 | -3.1 | -0.4 |
| XBL14 | No.25~26 | 0.0 | -0.1 | 0.7 | 2.2 | 0.3 | -3.8 | – | -0.2 | 0.7 | 2.1 | 0.4 | -3.7 |
| XBL15 | No.27~28 | 0.0 | -0.2 | -0.3 | 0.8 | 2.3 | 3.4 | – | -0.3 | -0.2 | 0.7 | 2.3 | 3.3 |
| XBL16 | No.29~30 | 0.0 | -0.2 | -0.5 | -0.2 | 0.8 | 2.2 | – | -0.3 | -0.5 | -0.2 | 0.7 | 2.2 |
| XBL16 | No.31 | 0.0 | 0.0 | -0.3 | -0.6 | -0.9 | -1.1 | – | -0.1 | -0.2 | -0.8 | -0.9 | -1.1 |

ARRANGEMENT PATTERN OF COMB TEETH FOR MAXIMIZING LEFT-SHIFT AMOUNT OF f4P

MEASUREMENT VALUE (SUM VALUE) δf4P' = -(1.0 + 0.5 + 0.7 + 2.1 + 0.3 + 1.1 + 2.1 + 0.2 + 0.6) = -8.6MHz

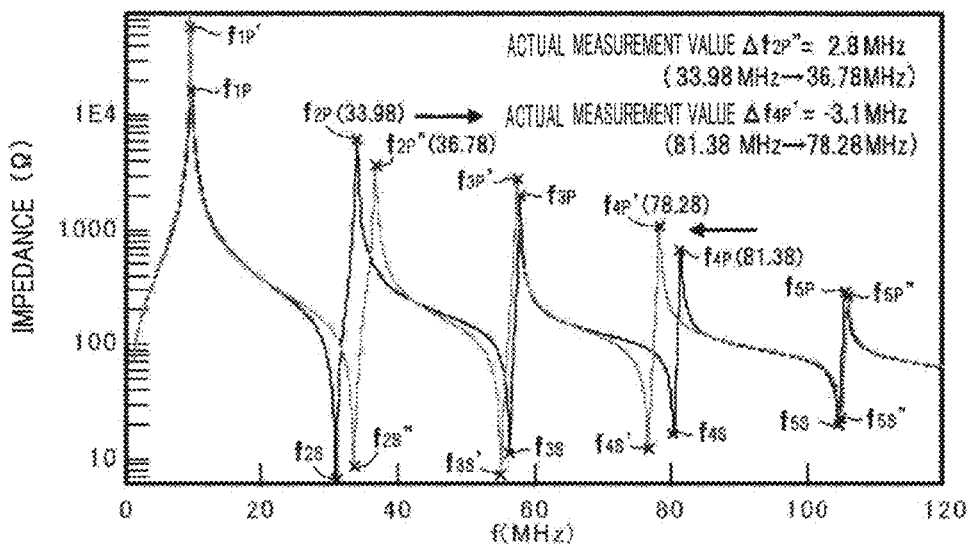
FIG. 25A / FIG. 25B

PLASMA PROCESSING APPARATUS

CROSS-REFERENCE TO RELATED APPLICATION

This application claims the benefit of Japanese Patent Application No. 2014-047963 filed on Mar. 11, 2014, the entire disclosures of which are incorporated herein by reference.

TECHNICAL FIELD

The embodiments described herein pertain generally to a plasma processing apparatus configured to perform a plasma process on a processing target substrate by using a high frequency power; and, more particularly, pertain to a plasma processing apparatus including an air core coil of a certain resonance characteristic without having any other reactance element provided between an electrical member other than a high frequency electrode within a processing vessel and an external circuit (particularly, a power supply circuit).

BACKGROUND

In micro-processing for manufacturing a semiconductor device or a FPD (Flat Panel Display) using plasma, it is very important to control a temperature or a temperature distribution of a processing target substrate (a semiconductor wafer, a glass substrate, etc.) as well as to control a plasma density distribution on the processing target substrate. If the temperature control of the substrate is not properly performed, not only the uniformity of a surface reaction of the substrate but also the uniformity of process characteristics may not be achieved, so that a production yield of semiconductor devices or display devices is decreased.

In general, a mounting table or susceptor, which mounts thereon a processing target substrate within a chamber of a plasma processing apparatus (particularly, a capacitively coupled plasma processing apparatus), has a function as a high frequency electrode that applies a high frequency power into a plasma space, a function as a holder that holds thereon the substrate by electrostatic attraction or the like, and a function as a temperature controller that controls the temperature of the substrate to a preset temperature through heat transfer. As for the temperature control function, it is required to appropriately correct a heat input characteristic distribution of the substrate affected by non-uniform radiant heat from plasma or a wall of the chamber, or a heat distribution affected by a substrate supporting structure.

Conventionally, in order to control the temperature of the susceptor and, further, the temperature of the substrate, a heater structure is widely employed. In this heater structure, a heating element that generates heat by an electric current applied thereto is provided in the susceptor, and Joule heat generated by the heating element is controlled. When using this heater structure, however, a part of a high frequency power applied to the susceptor from a high frequency power supply may be easily introduced into a heater power feed line through the heating element as a noise. If this high frequency noise reaches a heater power supply through the heater power feed line, operation and performance of the heater power supply is degraded. Furthermore, if a high frequency current flows in the heater power feed line, the high frequency power may be wasted. Typically, to solve these problems, a filter that reduces or blocks the high frequency noise flowing from the heating element embedded in the susceptor is provided on the heater power feed line.

The present applicant describes, in Patent Document 1, a filter technique that provides improved stability and reproducibility of filter performance for blocking a high frequency noise introduced to a line such as a power feed line or a signal line from an electrical member other than a high frequency electrode within a processing vessel of a plasma processing apparatus. This filter technique employs a regular multiple parallel resonance characteristic of a distributed constant line. Accordingly, only one air core coil is provided, and, also, stable noise blocking characteristic less affected by the apparatus difference can be obtained.

Further, the present applicant also describes, in Patent Document 1, a technique of a parallel resonance frequency adjuster capable of controlling at least one of multiple parallel resonance frequencies by locally changing characteristic impedance of the distributed constant line by way of, for example, coaxially providing a conductive ring member between the air core coil and an external conductor. Since at least one of the multiple parallel resonance frequencies can be set to be equal to or approximate to a frequency of a high frequency noise to be blocked, sufficiently high impedance as required can be applied to the frequency of this high frequency noise by the parallel resonance frequency adjuster. Thus, the heater power supply can be protected securely, and reproducibility and reliability of the plasma process can be improved.

Patent Document 1: Japanese Patent Laid-open Publication No. 2011-135052

However, in the prior art described in Patent Document 1, since a distance between the coil and the external conductor is locally narrowed at the position where the ring member is provided, an impedance function and a withstanding voltage characteristic of the coil against the high frequency noise are degraded. That is, a potential of a high frequency power on the heater power feed line is as high (e.g., several thousands of volts) as a surface potential of a power feed rod or the susceptor (lower high frequency electrode) at an inlet portion of a filter unit. Further, the potential of the high frequency power decreases gradually in an axial direction along a winding of the coil within the filter unit, and becomes several tens of volts at a termination end of the coil. If the ring member as mentioned above is provided, however, the high frequency noise flows to the ground on the way down the coil while bypassing an air gap and the ring member provided outwardly in a radial direction. As a result, the impedance function of the filter unit against the high frequency noise cannot be sufficiently exerted, and damage or early degradation of components (coil conductor, coil tube, ring member, etc.) in the vicinity of a bypass in which the high current flows may easily occur.

In the plasma processing apparatus using the high frequency power for the plasma process, various transmission circuits such as a matching unit, a filter circuit and a connecting circuit are provided on a line that electrically connects the high frequency power supply provided at the outside of the chamber and the electrode provided at the inside or in the vicinity of the chamber. In such a case, if a relatively short air core coil serving as a lumped constant element is used as a coil included in the transmission circuit, a parallel LC circuit may be formed between self-inductance of the air core coil and a parasitic capacitance in the vicinity of the air core coil, so that self-resonance may easily occur. From one point of view, such self-resonance characteristic of the air core coil may block an undesired high frequency power, for example, a harmonic wave on the line.

In such a case, the air core coil needs to have preset self-inductance required within the transmission circuit and, also, a self-resonance frequency close to a frequency of the harmonic wave to be blocked. Typically, the self-inductance, which is determined uniquely by a diameter, a length and a winding number of the coil itself, is the main condition that the air core coil needs to satisfy. Meanwhile, since the self-resonance frequency depends on a parasitic capacitance of the air core coil, i.e., a capacitance between coil wires or between a stray capacitance generated between the coil and an adjacent conductor such as a housing, the self-resonance frequency can be adjusted from this aspect. That is, the vicinity of the air core coil needs to be designed such that a parasitic capacitance (capacitance between the coil wires, stray capacitance) that applies the required self-resonance frequency is formed under the required self-inductance. Actually, however, there exists non-uniformity or variation in the winding structure of the air core coil on the manufacturing level, and, currently, there is proposed no effective way to adjust the self-resonance frequency in the vicinity of the air core coil.

SUMMARY

In view of the foregoing problems, example embodiments provide a plasma processing apparatus including a filter capable of adjusting or optimizing a preset resonance frequency by shifting the preset resonance frequency as required without reducing an impedance function or a withstanding voltage characteristic against a high frequency noise, when blocking, by using a multiple parallel resonance characteristic of a distributed constant line, the high frequency noise introduced into a line such as a power feed line or a signal line from an electrical member other than a high frequency electrode within a processing vessel.

Further, the example embodiments also provide the plasma processing apparatus capable of adjusting or optimizing a self-resonance frequency by shifting the self-resonance frequency of an air core coil serving as a lumped constant element on a line between an external circuit of a power meter or a signal meter and the preset electrical member within the processing vessel in which a plasma process is performed.

In one example embodiment, a plasma processing apparatus includes an external circuit of a power meter or a signal meter electrically connected via a line to an electrical member within a processing vessel in which a plasma process is performed, and reduces or blocks a high frequency noise of a preset frequency introduced from the electrical member into the line toward the external circuit by a filter provided on the line. The filter includes an air core coil having a preset diameter and a preset length; a cylindrical external conductor, accommodating or surrounding the air core coil, configured to form, by being combined with the air core coil, a distributed constant line in which parallel resonance of multiple frequencies corresponding to multiple parallel resonance frequencies occurs; and first comb teeth and second comb teeth which are made of an insulating material and selectively inserted into winding gaps of the air core coil. Further, each of the first comb teeth has a thickness smaller than a standard thickness that allows a uniform winding gap over an entire length of the air core coil, and the first comb teeth are inserted into one or more effective zones, which are arranged separately in a lengthwise direction of the air core coil, to shift one or more of the plural parallel resonance frequencies to a lower frequency range in a frequency-impedance characteristic of the filter. Furthermore, each of the second comb teeth has a thickness equal to or larger than the standard thickness and the second comb teeth are inserted into the winding gaps in which the first comb teeth are not inserted, regardless of whether the second comb teeth are provided in the one or more effective zones.

In this plasma processing apparatus, by selectively inserting the first comb teeth and the second comb teeth having the relative thickness relationship into the respective winding gaps of the air core coil, and, by appropriately selecting the distribution of the first comb teeth and the second comb teeth with respect in a preset effective zone, there is obtained high reproducibility for adjusting one or more of plural $N^{th}$ resonance frequencies to a required value within a certain range. Therefore, a required frequency-impedance characteristic or a filter characteristic having no object difference can be obtained.

In another example embodiment, a plasma processing apparatus includes an external circuit of a power meter or a signal meter electrically connected via a line to an electrical member within a processing vessel in which a plasma process is performed; an air core coil that is provided on the line and has a self-resonance frequency; and first comb teeth and second comb teeth which are made of an insulating material and selectively inserted into wining gaps of the air core coil. Further, each of the first comb teeth has a thickness smaller than a standard thickness that allows a uniform winding gap over an entire length of the air core coil, and the first comb teeth are inserted into one or more effective zones, which are arranged separately in a lengthwise direction of the air core coil, to shift the self-resonance frequency to a lower frequency range in a frequency-impedance characteristic of the air core coil. Furthermore, each of the second comb teeth has a thickness equal to or larger than the standard thickness and the second comb teeth are inserted into the winding gaps in which the first comb teeth are not inserted, regardless of whether the second comb teeth are provided in the one or more effective zones.

In this plasma processing apparatus, by selectively inserting the first comb teeth and the second comb teeth having the relative thickness relationship into the respective winding gaps of the air core coil, and, by appropriately selecting the distribution of the first comb teeth and the second comb teeth with respect in a preset effective zone, there is obtained high reproducibility for adjusting a self-resonance frequency of the air core coil to a required value within a certain range. Therefore, a required frequency-impedance characteristic having no object difference can be obtained.

In the present disclosure, the effective zone refers to a zone in which a shift effect is obtained when the first comb teeth are inserted in certain winding gaps within the zone in a lengthwise direction of the air core coil, in shifting a preset resonance frequency to a required direction (to a lower frequency range or a higher frequency range) in the frequency-impedance characteristic of the filter or the air core coil.

Further, typically, if the first comb teeth are arranged at positions other than the effective zone, an effect of reducing the shift effect or a reverse-shift effect of shifting the preset resonance frequency to an opposite direction to the required direction can be obtained.

According to the plasma processing apparatus of the example embodiments, with the above-described configuration and operation, it is possible to adjust or optimize a resonance frequency by shifting the resonance frequency as required without reducing an impedance function or a withstanding voltage characteristic against a high frequency noise, when blocking, by using a multiple parallel resonance characteristic of a distributed constant line, the high frequency noise introduced into a line such as a power feed line or a signal line from the electrical member other than the high frequency electrode within the processing vessel.

In addition, according to the plasma processing apparatus of the example embodiments, with the above-described configuration and operation, it is also possible to adjust or optimize a self-resonance frequency by shifting the self-resonance frequency of an air core coil serving as a lumped constant element on a line between an external circuit of a power meter or a signal meter and a preset electrical member within the processing vessel in which a plasma process is performed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 22 is a diagram showing measurement data obtained for the presence/absence of the shift, the shift direction and the shift amount in the case where the first comb teeth are inserted in every second winding gap in the above experimental example;

FIG. 25A is a diagram showing a comb teeth arrangement pattern set to perform the right-shift control for the second resonance frequency and the left-shift control for the fourth resonance frequency at the same time in the above experimental example;

FIG. 25B is a diagram showing a frequency-impedance characteristic of a filter in which a comb-teeth member having the comb teeth arrangement pattern of FIG. 24A is coupled to the air core coil, in comparison with a comparison reference frequency-impedance characteristic (standard characteristic);

DETAILED DESCRIPTION

Figure 1:
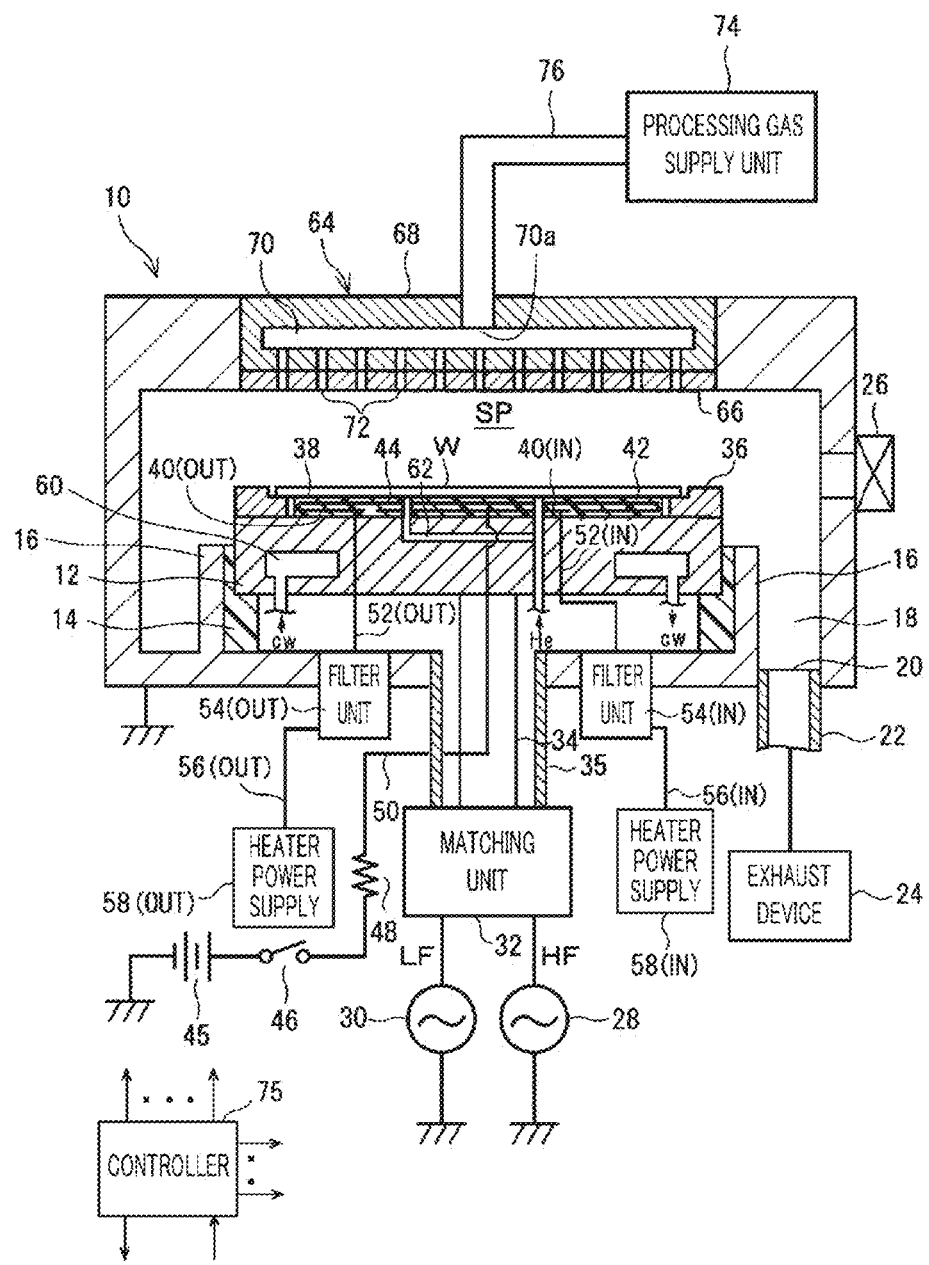
FIG. 1 is a longitudinal cross sectional view illustrating an overall configuration of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

(Overall Configuration of Plasma Processing Apparatus)

FIG. 1 illustrates a configuration of a plasma processing apparatus in accordance with an example embodiment. The plasma processing apparatus is configured as a capacitively coupled plasma etching apparatus in which dual frequency powers are applied to a lower electrode. The plasma etching apparatus includes a cylindrical chamber (processing vessel) 10 made of, e.g., a metal material such as aluminum or stainless steel. The chamber 10 is grounded.

A circular plate-shaped susceptor 12 configured to mount thereon a processing target substrate, e.g., a semiconductor wafer W is horizontally disposed as a lower electrode in the chamber 10. The susceptor 12 is made of, but not limited to, aluminum and supported on an insulating cylindrical supporting member 14 without being grounded. The insulating cylindrical supporting member 14 is made of, but not limited to, a ceramic material and vertically extended upwards from a bottom of the chamber 10. An annular exhaust path 18 is formed between an inner wall of the chamber 10 and a conductive cylindrical supporting member 16 that is vertically extended upwards from the bottom of the chamber 10 along a periphery of the insulating cylindrical supporting member 14. An exhaust opening 20 is formed at a bottom of the exhaust path 18, and an exhaust device 24 is connected to the exhaust opening 20 through an exhaust pipe 22. The exhaust device 24 includes a vacuum pump such as a turbo molecular pump and is capable of depressurizing a processing space within the chamber 10 to a required vacuum level. A gate valve 26 configured to open and close a loading/unloading opening for the semiconductor wafer W is provided at a sidewall of the chamber 10.

The susceptor 12 is electrically connected with a first high frequency power supply 28 and a second high frequency power supply 30 via a matching unit 32 and a power feed rod 34. The first high frequency power supply 28 is configured to output a first high frequency power HF of a certain frequency (typically, equal to or higher than, e.g., about 27 MHz, desirably, 60 MHz or higher) that mainly contributes to plasma generation. Meanwhile, the second high frequency power supply 30 is configured to output a second high frequency power LF of a certain frequency (typically, equal to or lower than, e.g., about 13 MHz) that mainly contributes to ion attraction into the semiconductor wafer W mounted on the susceptor 12. The matching unit 32 accommodates a first matching circuit 132 and a second matching circuit 134 (see FIG. 27) configured to match impedance between the first and second high frequency power supplies 28 and 30 and a plasma load, respectively.

The power feed rod 34 is made of a cylindrical or columnar conductor having a certain outer diameter. An upper end of the power feed rod 34 is connected to a central portion of a bottom surface of the susceptor 12, and a lower end of the power feed rod 34 is connected to high frequency output terminals of the first and second matching circuits 132 and 134 within the matching unit 32. Further, a cylindrical conductive cover 35 surrounding the power feed rod 34 is provided between a bottom surface of the chamber 10 and the matching unit 32. To elaborate, a circular opening having a certain diameter larger than the outer diameter of the power feed rod 34 is formed at the bottom surface of the chamber 10. An upper end of the conductive cover 35 is connected to this opening of the chamber while a lower end thereof is connected to ground (returning wire) terminals of the matching unit.

The susceptor 12 has a diameter larger than that of the semiconductor wafer W. A top surface of the susceptor 12 is divided into a central region having the substantially same shape (circular shape) and the substantially same size as those of the wafer W, i.e., a wafer mounting portion; and an annular peripheral region extended outwards from the wafer mounting portion. The semiconductor wafer W as a processing target object is mounted on the wafer mounting portion. A ring-shaped plate member, i.e., a so-called focus ring 36 is mounted on the annular peripheral region. The focus ring 36 has an inner diameter larger than the diameter of the semiconductor wafer W and may be made of, by way of example, but not limitation, one of Si, SiC, C and $SiO_2$ depending on a material of the semiconductor wafer W to be etched.

An electrostatic chuck 38 configured to attract and hold the wafer and a heating element 40 are provided on the wafer mounting portion of the top surface of the susceptor 12. In the electrostatic chuck 38, a DC electrode 44 is embedded within a film-shaped or plate-shaped dielectric member 42 that is formed or fastened on the top surface of the susceptor 12 as one body therewith. The DC electrode 44 is electrically connected with a DC power supply 45 provided at the outside of the chamber 10 via a switch 46, a resistor 48 having a high resistance value and a DC high voltage line 50. If a high DC voltage is applied to the DC electrode 44 from the DC power supply 45, the semiconductor wafer W can be attracted to and held on the electrostatic chuck 38 by an electrostatic force. The DC high voltage line 48 is a coated line and is connected to the DC electrode 44 of the electrostatic chuck 38 while penetrating the susceptor 12 from below after passing through the inside of the cylindrical power feed rod 34.

Figure 3:
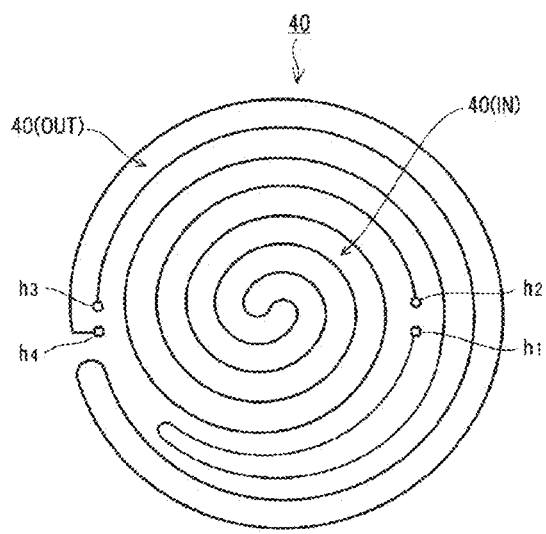
FIG. 3 is a diagram illustrating a configuration example of the heating element in the example embodiment.

The heating element 40 is implemented by, for example, a resistance heating wire having a spiral shape, which is embedded in the dielectric member 42 of the electrostatic chuck 38 along with the DC electrode 44. In this example embodiment, this heating element 40 is divided in two parts in a radial direction of the susceptor 12: an inner heating wire 40(IN) and an outer heating wire 40(OUT), as depicted in FIG. 3. Among these components, the inner heating wire 40(IN) is electrically connected to a dedicated heater power supply 58(IN) provided at the outside of the chamber 10 via power feed conductors 52(IN) covered with an insulating coating, a filter unit 54(IN) and electric cables 56(IN). The outer heating wire 40(OUT) is electrically connected to a dedicated heater power supply 58(OUT) provided at the outside of the chamber 10 via power feed conductors 52(OUT) covered with an insulating coating, a filter unit 54(OUT) and electric cables 56(OUT). Among these components, the filter units 54(IN) and 54(OUT) are primary features of the present example embodiment, and an internal configuration and an operation of these filter units will be described in detail later.

An annular coolant room or coolant path 60 extended along, e.g., a circumferential direction is formed within the susceptor 12. A coolant of a preset temperature, e.g., cooling water cw from a chiller unit (not shown) is supplied into and circulated through the coolant path 60 via a coolant supply line. A temperature of the susceptor 12 can be reduced by adjusting the temperature of the coolant. Further, a heat transfer gas such as a He gas from a heat transfer gas supply unit (not shown) is supplied to an interface between the electrostatic chuck 38 and the semiconductor wafer W through a gas supply line and a gas passage 62 within the susceptor 12 in order to thermally connect the semiconductor wafer W to the susceptor 12.

A shower head 64 serving as an upper electrode is provided at a ceiling of the chamber 10, facing the susceptor 12 in parallel. The shower head 64 includes an electrode plate 66 directly facing the susceptor 12; and an electrode supporting body 68 configured to support the electrode plate 66 from a backside thereof (from above it) in a detachable manner. A gas room 70 is formed within the electrode supporting body 68, and a multiple number of gas discharge holes 72 extended from the gas room 70 toward the susceptor 12 are formed through the electrode supporting body 68 and the electrode plate 66. A space SP between the electrode plate 66 and the susceptor 12 serves as a plasma generation space or a processing space. A gas supply line 76 led from a processing gas supply unit 74 is connected to a gas inlet opening 70a formed at a top portion of the gas room 70. The electrode plate 66 may be made of, by way of non-limiting example, but not limitation, Si, SiC or C, and the electrode supporting body 68 may be made of, by way of example, but not limitation, alumite-treated aluminum.

Operations of individual components of the plasma etching apparatus, e.g., the exhaust device 24, the high frequency power supplies 28 and 30, the switch 46 of the DC power supply 45, the heater power supplies 58(IN) and 58(OUT), the chiller unit (not shown), the heat transfer gas supply unit (not shown), the processing gas supply unit 74, and so forth and the overall operation (sequence) of the plasma etching apparatus are controlled by a controller 75 having a microcomputer.

In this plasma etching apparatus, in order to perform an etching process, the gate valve 26 is first opened, and the semiconductor wafer W to be processed is loaded into the chamber 10 and mounted on the electrostatic chuck 38. Then, an etching gas (generally, a mixture gas) is introduced into the chamber 10 from the processing gas supply unit 74 at a certain flow rate, and an internal pressure of the chamber 10 is controlled to a preset value by the exhaust device 24. Further, the first and second high frequency power supplies 28 and 30 are powered on, and the first and second high frequency power supplies 28 and 30 output the first high frequency power HF and the second high frequency power LF at required power levels, respectively, and apply the high frequency powers HF and LF to the susceptor (lower electrode) 12 via the matching unit 32 and the power feed rod 34. Further, the heat transfer gas (e.g., a He gas) is supplied to the interface between the electrostatic chuck 38 and the semiconductor wafer W from the heat transfer gas supply unit. Further, by turning on the switch 46 for the electrostatic chuck, the heat transfer gas is confined into the interface between the electrostatic chuck 38 and the semiconductor wafer W by an electrostatic attracting force. Meanwhile, by turning on the heater power supplies 58(IN) and 58(OUT), Joule heats are generated by the inner heating wire 40(IN) and the outer heating wire 40(OUT), respectively, so that the temperature or a temperature distribution of the top surface of the susceptor 12 can be controlled to a preset value. The etching gas discharged from the shower head 64 is excited into plasma by a high frequency discharge between the susceptor 12 and the shower head 64 (i.e., between the two facing electrodes). A processing target film on the surface of the semiconductor wafer W is etched to have a required pattern by radicals or ions in the plasma.

In this capacitively coupled plasma etching apparatus, by applying the first high frequency power HF having a relatively higher frequency (desirably, equal to or higher than 60 MHz) suitable for plasma generation to the susceptor 12, plasma can be highly densified in a desirably dissociated state. Accordingly, high-density plasma can be generated under a lower pressure condition. Further, by applying the second high frequency power LF having a relatively lower frequency (equal to or lower than 13 MHz) suitable for ion attraction to the susceptor 12, an anisotropic etching process having high selectivity can be performed on the semiconductor wafer W mounted on the susceptor 12.

Moreover, in this capacitively coupled plasma etching apparatus, the susceptor 12 is cooled by the chiller unit and heated by the heater, and the heating by the heater is controlled independently at the central region and the annular peripheral region of the susceptor 12 in the radial direction thereof. Thus, the temperature can be changed and increased or decreased rapidly at a high speed, and profile of the temperature distribution can be controlled as required or in various ways.

In addition, in this capacitively coupled plasma etching apparatus, a part of the first and second high frequency powers HF and LF applied to the susceptor 12 from the first high frequency power supplies 28 and 30, respectively, is introduced into the power feed conductors 52(IN) and 52(OUT) as high frequency noises via the inner heating wire 40(IN) and the outer heating wire 40(OUT) provided in the susceptor 12 during the etching process. If any of these high frequency noises of the dual frequencies is introduced into the heater power supplies 58(IN) and 58(OUT), operation or performance of the heater power supplies 58(IN) and 58(OUT) may be deteriorated.

To solve this problem, as stated above, the filter units 54(IN) and 54(OUT) are provided on heater power feed lines that electrically connect the heater power supplies 58(IN) and 58(OUT) and the inner and outer heating wires 40(IN) and 40(OUT), respectively. The filter units 54(IN) and 54(OUT) perform a filter blocking function having sufficiently high impedance against any one of the noises of the first and second high frequency powers HF and LF introduced into the heater power feed lines from the inner heating wire 40(IN) and the outer heating wire 40(OUT) efficiently and stably with low power consumption, as will be described in detail later. Accordingly, the plasma etching apparatus of the present example embodiment is capable of improving the wafer temperature control function through the heater structure and, also, capable of effectively suppressing or reducing a leakage of the first and second high frequency powers HF and LF into the heater power feed lines from the chamber 10 through the heating element 40 within the susceptor 12. Thus, reproducibility and reliability of the plasma process can be improved.

(Circuit Configuration within Filter Unit)

Now, a circuit configuration within the filter units 54(IN) and 54(OUT) in this plasma etching apparatus will be explained.

Figure 2:
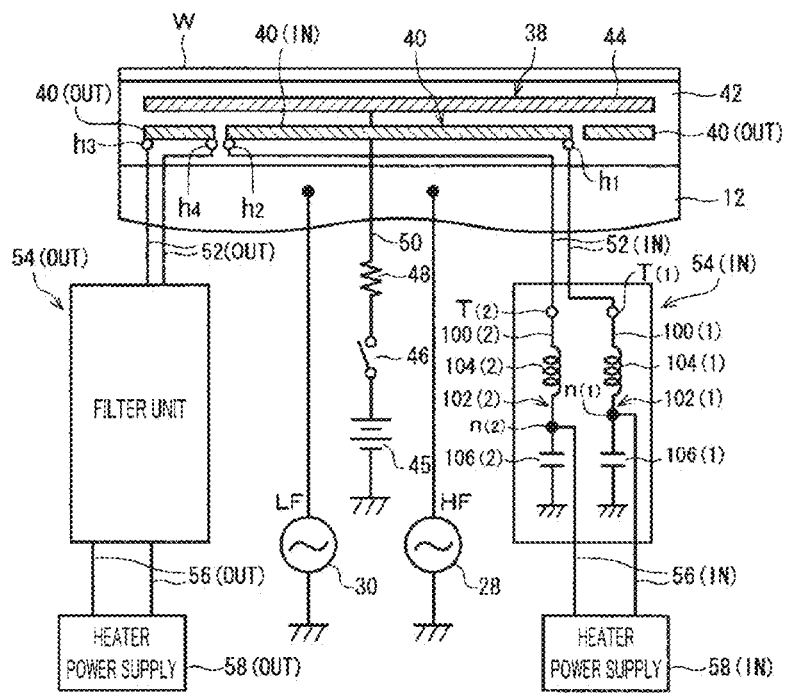
FIG. 2 is a diagram illustrating a circuit configuration of a heater power supply unit configured to apply a power to a heating element of a susceptor in the example embodiment.

FIG. 2 illustrates circuit configurations of heater power supply units configured to apply a power to the heating element 40 provided in the susceptor 12. In this example embodiment, the heater power supply units having the substantially same circuit configuration are connected to the inner heating wire 40(IN) and the outer heating wire 40(OUT) of the heating element 40, respectively. With this configuration, heating amounts or heating temperatures of the inner heating wire 40(IN) and the outer heating wire 40(OUT) can be controlled individually. In the following description, a configuration and an operation of the heater power supply unit for the inner heating wire 40(IN) will be elaborated. The heater power supply unit for the outer heating wire 40(OUT) has the completely same configuration and operation.

The heater power supply 58(IN) is an AC output power supply that performs a switching (ON/OFF) operation for a commercial frequency by using, e.g., SSR (Solid State Relay). The heater power supply 58(IN) is connected with the inner heating wire 40(IN) in a closed-loop circuit. To elaborate, a first output terminal of a pair of output terminals of the heater power supply 58(IN) is electrically connected to a first terminal $h_1$ of the inner heating wire 40(IN) via a first power feed line (power cable) 100(1), and a second output terminal thereof is electrically connected to a second terminal $h_2$ of the inner heating wire 40(IN) via a second power feed line (power cable) 100(2).

The filter unit 54(IN) includes a first filter 102(1) and a second filter 102(2) provided on the way of the first heater power feed line 100(1) and the second heater power feed line 100(2), respectively. These two filters 102(1) and 102(2) have the substantially same circuit configurations.

To be more specific, the filters 102(1) and 102(2) have air core coils 104(1) and 104(2) that are grounded via capacitors 106(1) and 106(2), respectively. One terminals or filter terminals T(1) and T(2) of the air core coils 104(1) and 104(2) are connected to the terminals $h_1$ and $h_2$ of the inner heating wire 40(IN) via the pair of power feed conductors 52(IN), respectively. The capacitors 106(1) and 106(2) are connected between the other terminals of the air core coils 104(1) and 104(2) and a conductive member having a ground potential (e.g., the chamber 10). Connection points n(1) and n(2) between the air core coils 104(1) and 104(2) and the capacitors 106(1) and 106(2) are connected to the first and second output terminals of the heater power supply 58(IN) via the electric cables (pair cables) 56(IN), respectively.

In the heater power supply unit having the above-described configuration, during a positive cycle, an electric current outputted from the heater power supply 58(IN) may flow from the first terminal $h_1$ to the inner heating wire 40(IN) through the first power feed line 100(1), i.e., through the electric cable 56(IN), the air core coil 104(1) and the power feed conductor 52(IN), so that each part of the inner heating wire 40(IN) generates Joule heat. Then, after flowing from the second terminal $h_2$, the electric current is returned back through the second power feed line 100(2), i.e., through the power feed conductor 52(IN), the air core coil 104(2) and the electric cable 56(IN). During a negative cycle, the electric current flows through the same circuit in the reverse direction to that stated above. Since the electric current of this AC output from the heater has a commercial frequency, impedance of the air core coils 104(1) and 104(2) or voltage drops thereof may be negligibly small, and the amount of a leakage current flowing to the earth through the capacitors 106(1) and 106(2) may also be negligibly small.

(Physical Configuration within Filter Unit)

Figure 4A:
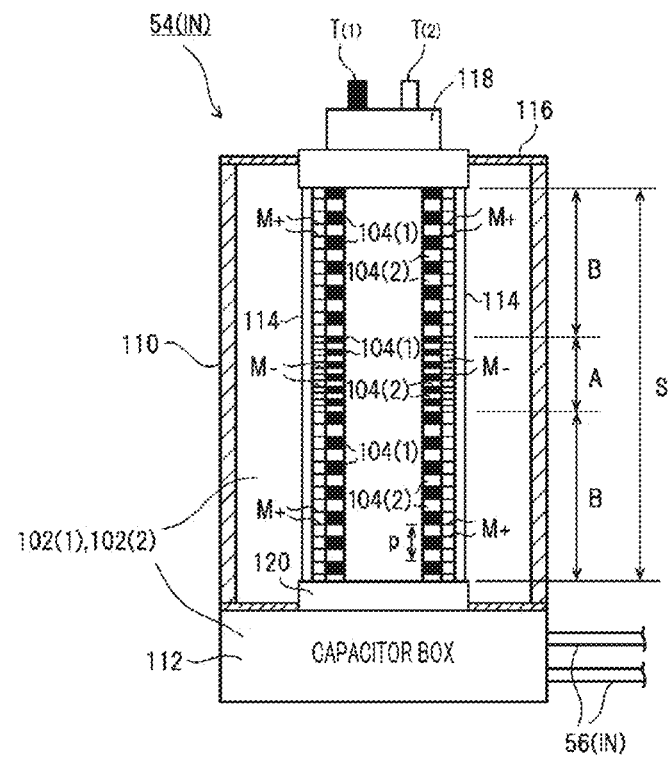
FIG. 4A is a longitudinal cross sectional view illustrating a structure of a filter unit in a first experimental example.
Figure 4B:
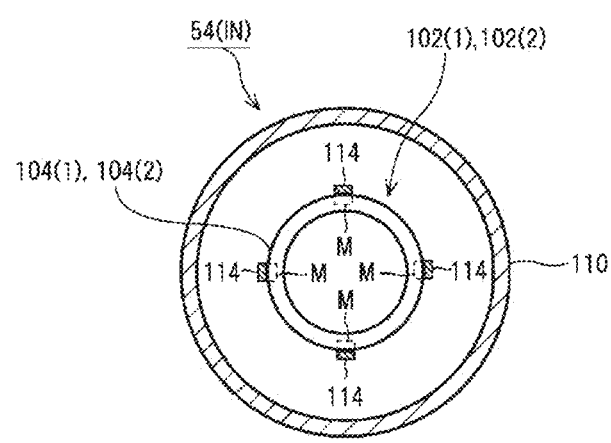
FIG. 4B is a horizontal cross sectional view illustrating the structure of the filter unit.
Figure 5A:
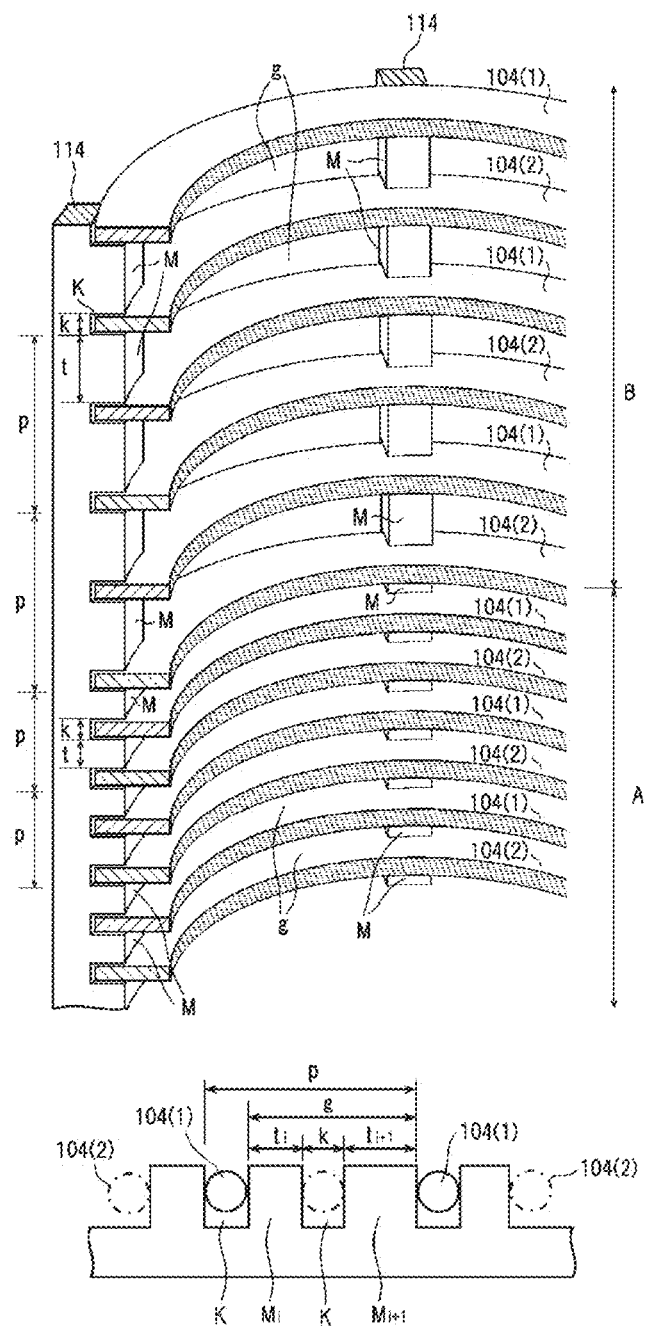
FIG. 5A is a partially enlarged perspective view illustrating a configuration of major parts of the filter unit.

FIG. 4A, FIG. 4B and FIG. 5A (FIG. 5B) illustrate a physical structure within the filter unit 54(IN) in this example embodiment. The filter unit 54(IN) includes, as depicted in FIG. 4A and FIG. 4B, a cylindrical external conductor 110 made of, but not limited to, aluminum, in which the air core coil 104(1) of the first filter 102(1) and the air core coil 104(2) of the second filter 102(2) are arranged coaxially. Further, the filter unit 54(IN) also includes a capacitor box 112 which is made of, but not limited to, aluminum and provided at the opposite side from the filter terminals T(1) and T(2). In the capacitor box 112, the capacitor 106(1) of the first filter 102(1) and the capacitor 106(2) of the second filter 102(2) (FIG. 2) are accommodated. The external conductor 110 is screw-coupled to a conductive member of a ground potential, for example, the chamber 10.

Each of the air core coils 104(1) and 104(2) is a solenoid coil implemented by an electric wire or coil conductor wound into a cylindrical shape without having an iron core. Each of the air core coils 104(1) and 104(2) has a thick coil wire or coil conductor and a large coil size (e.g., a diameter of 22 mm to about 45 mm and a length of about 130 mm to about 280 mm). With this configuration, each of air core coils 104(1) and 104(2) may serve as a power feed line through which a sufficiently large electric current (e.g., about 30 A) flows into the inner heating wire 40(IN) from the heater power supply 58(IN), and further, may obtain very large inductance and a large line length with the air core without having a magnetic core such as ferrite for the purpose of suppressing heat generation (power loss).

Within the cylindrical external conductor 110, the two air core coils 104(1) and 104(2) stand uprightly on the capacitor box 112 by being supported by a supporting member (not shown) which is made of an insulator, e.g., a resin. The coil conductor of each of the air core coils 104(1) and 104(2) is spirally wound at a variable winding pitch p in multiple stages in a substantially bare wire state without being covered with a coil sleeve, and has the same coil length S.

In the vicinity of the air core coils 104(1) and 104(2), a multiple number of, e.g., four rod-shaped comb-teeth members 114, which are extended in parallel to a longitudinal direction of the coil, are provided adjacent to the outer periphery of the air core coils 104(1) and 104(2) at a regular interval in a circumferential direction thereof. Each comb-teeth member 114 is made of a resin having high hardness, processability and heat resistance, such as, but not limited to, an insulator, e.g., PEEK or PCTFE, and is fixed in the filter unit 54(IN) independently from the air core coils 104(1) and 104(2).

As depicted in FIG. 5A, comb teeth M are formed on an inner surface of each comb-teeth member 114, and the comb teeth M are inserted into respective winding gaps of the air core coils 104(1) and 104(2). From another viewpoint, the coil conductor of each of the air core coils 104(1) and 104(2) is inserted into each slit K between every two adjacent comb teeth $M_i$ and $M_{i+1}$. Here, a gap width k of the slit K is the substantially same as a thickness of the coil conductor, and is uniform or regular from one end of each coli to the other end thereof.

A wining gap g and a winding pitch p at each position of each of the air core coils 104(1) and 104(2) depend on thicknesses $t_i$ and $t_{i+1}$ of the comb teeth $M_i$ and $M_{i+1}$ at that position and are represented by equations of $g=t_i+t_{i+1}+k$, $p=g+k=t_i+t_{i+1}+2k$. If a standard thickness of a comb tooth M that assigns a uniform winding gap gs and a uniform winding pitch ps over the entire length of each coil is set as ts, there is established a relationship of $gs=2ts+k$, $ps=2(ts+k)$.

In the configuration shown in FIG. 4A, a comb tooth M− at a central portion of each of the air core coils 104(1) and 104(2) has a thickness t− smaller than the standard thickness ts, whereas comb tooth M+ at both sides or both end portion of each coil has a thickness t+ equal to or larger than the standard thickness ts. Implications or effects of this technique of selecting a thickness of a comb tooth M between two options of t−<ts and ts≤t+ depending on the positions of the winding gaps of the air core coils 104(1) and 104(2) will be elaborated in detail later.

An annular cover body 116 and an upper connector 118 made of a resin are provided at an upper opening of the external conductor 110. Upper ends of the aforementioned non-illustrated supporting member of the coil and the comb-teeth members 114 are coupled to the upper connector 118. Further, upper ends of the air core coils 104(1) and 104(2) are electrically connected to the filter terminals T(1) and T(2), respectively, within or in the vicinity of the upper connector 118.

A lower connector 120 is provided on a top surface of the capacitor box 112, and lower ends of the aforementioned supporting member and the comb-teeth members 114 are coupled to the lower connector 120. Further, lower ends of the air core coils 104(1) and 104(2) are connected to the connection points n(1) and n(2) and the capacitors 106(1) and 106(2) (FIG. 2), respectively, within or in the vicinity of the lower connector 120.

Further, a multiple number of vent holes (not shown) for air-cooling the air core coils 104(1) and 104(2) accommodated in the external conductor 110 are formed at the external conductor 110 by a punching process.

Figure 5B:
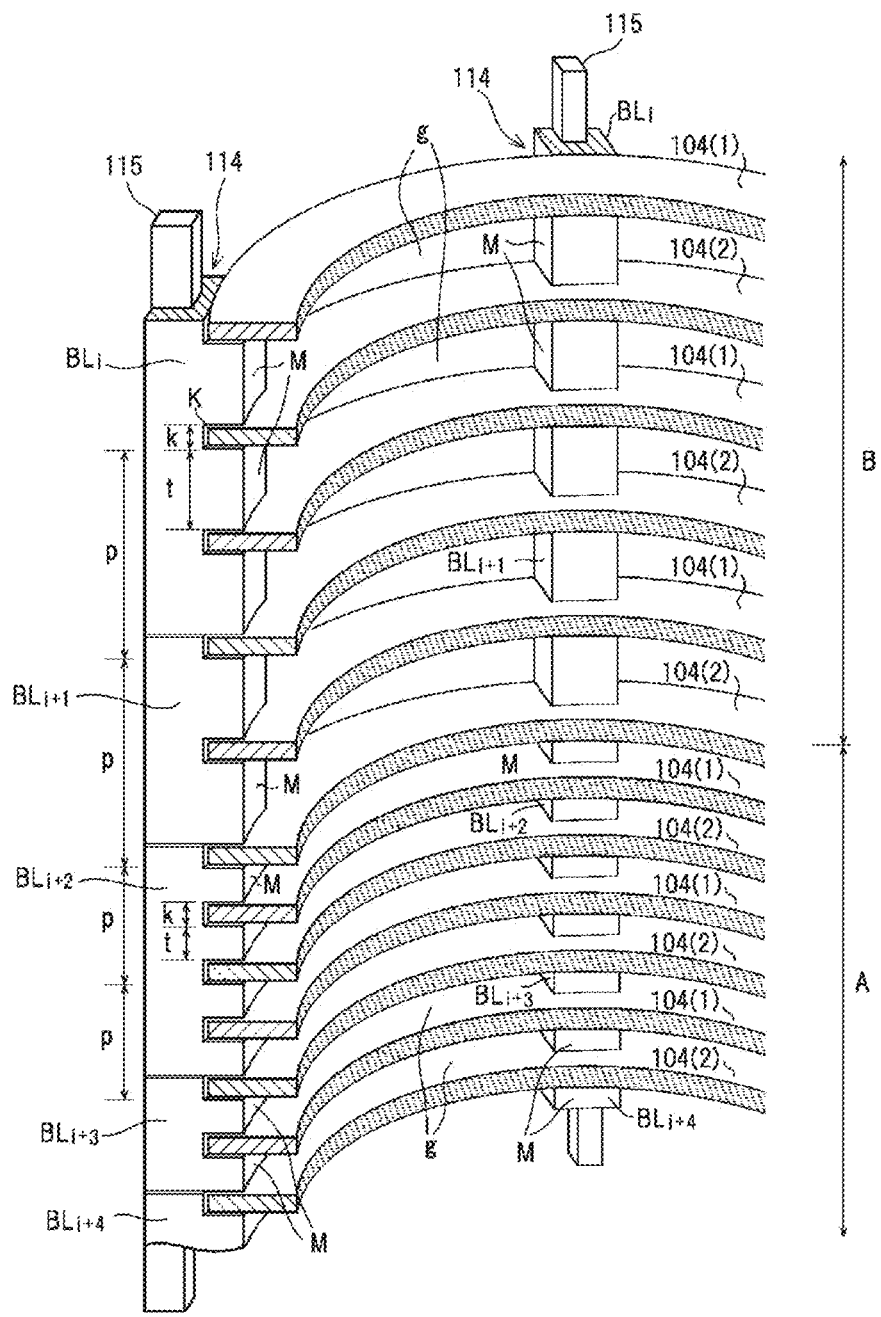
FIG. 5B is a partially enlarged perspective view illustrating a configuration of a comb-teeth member in accordance with a modification example.

FIG. 5B illustrates another configuration example of the comb-teeth member 114. In this configuration example, the comb-teeth member 114 is divided into multiple blocks ( . . . , $BL_i$, $BL_{i+1}$, $BL_{i+2}$, . . . ) in a coil lengthwise direction. The multiple blocks BL may have different lengths and are slidably provided on a rod-shaped guide or a supporting shaft 115. These multiple blocks ($BL_1 \sim BL_n$) are arranged in a row and comb teeth M are inserted in the respective winding gaps g of the coils 104(1) and 104(2). In each block BL, comb teeth M having a regular thickness t, which satisfies either one condition of t<ts or ts≤t, are formed at a regular distance t+k with slits K therebetween.

Figure 6:
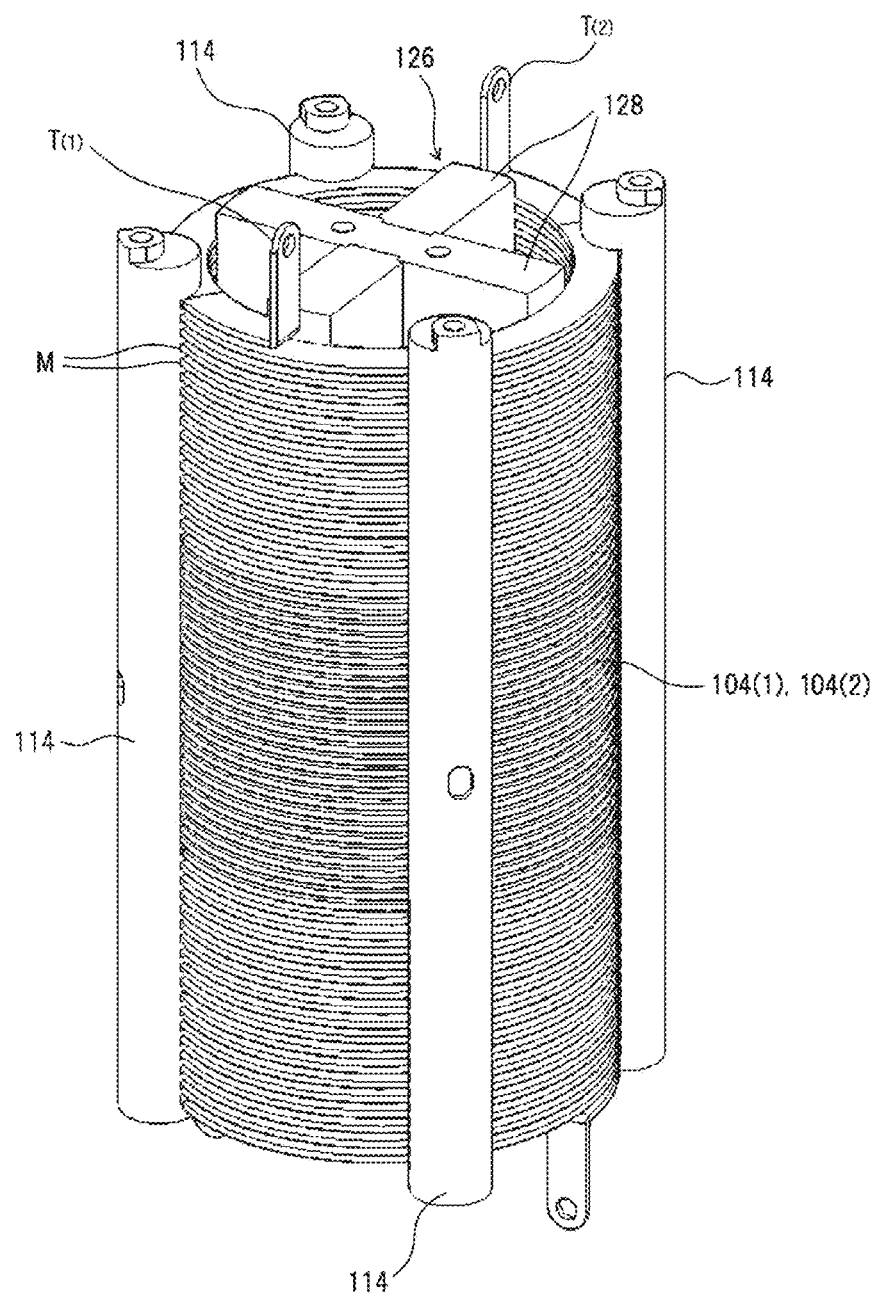
FIG. 6 is a perspective view illustrating a detailed configuration example of a sub-assembly in the vicinity of an air core coil in the filter unit.

FIG. 6 depicts configuration of a sub-assembly in the vicinity of the air core coils 104(1) and 104(2) in the example embodiment. As illustrated, the multiple (four) rod-shaped comb-teeth members 114 are coupled by bolts to a ring-shaped supporting body, which is made of, for example, a resin and surrounds the comb-teeth members 114 at multiple positions (three positions at both end portion and at an intermediate portion) in an axial direction. The comb teeth M formed on the inner surface of each comb-teeth member 114 are fitted (inserted) in the winding gaps g of the air core coils 104(1) and 104(2).

A coil supporting member 126 having, for example, a cross-shaped cross section is inserted into the air core coils 104(1) and 104(2). This coil supporting member 126 is formed of a multiple number of plate-shaped members 128 which are made of an insulator, e.g., a resin and are radially extended in a coil radial direction to come into contact with inner peripheral surfaces of the coils 104(1) and 104(2) and, also, extended in parallel to the coils 104(1) and 104(2) in the coil lengthwise direction.

(Operation of Filter Unit)

In the filter unit 54(IN) in accordance with the example embodiment, a distributed constant line is formed between the air core coils 104(1) and 104(2) of the first and second filters 102(1) and 102(2) and the external conductor 110.

In general, characteristic impedance $Z_0$ of a transmission line is expressed as $Z_0 = \sqrt{(L/C)}$ by using electrostatic capacitance C per a unit length and inductance L per a unit length when no loss is assumed. Further, a wavelength λ is calculated by the following equation.

$$\lambda = 2\pi/(\omega\sqrt{(LC)}) \quad (1)$$

Unlike in a general distributed constant line (especially, in a coaxial line) where a rod-shaped cylindrical conductor serves as the central portion of the transmission line, the cylindrical air core coils serve as a central conductor in the filter unit 54(IN). It is assumed that the inductance L per a unit length is mainly caused by the cylindrical coil. Meanwhile, the electrostatic capacitance per a unit length is defined as electrostatic capacitance C of a capacitor formed by a coil surface and the external conductor. In this filter unit 54(IN), when the inductance per a unit length and the electrostatic capacitance per a unit length are L and C, respectively, it is assumed that a distributed constant line of which characteristic impedance $Z_0$ is expressed as $Z_0=\sqrt{(L/C)}$ is formed.

When the filter unit having this distributed constant line is viewed from the side of the terminal T, since an opposite side thereof is nearly short-circuited by the capacitor having large capacitance (e.g., about 5000 pF), there may be obtained a frequency-impedance characteristic in which large impedance is repeated at a constant frequency interval. This impedance characteristic may be obtained when the wavelength and the length of the distributed line are same.

In this filter unit 54(IN), not a coil length of the air core coils 104(1) and 104(2) but a coil length S in the axial direction (FIG. 4A) becomes the length of the distributed line. By using the air core coils 104(1) and 104(2) as the central conductor, L can be increased to be much larger than that in case of using a rod-shaped cylindrical conductor as the central conductor, so that λ can be reduced. Thus, it is possible to realize an effective length that is a comparatively short line length (coil length S) and is equal to or larger than the wavelength. Further, it is possible to obtain an impedance characteristic in which large impedance is repeated at a comparatively short frequency interval.

Figure 7A:
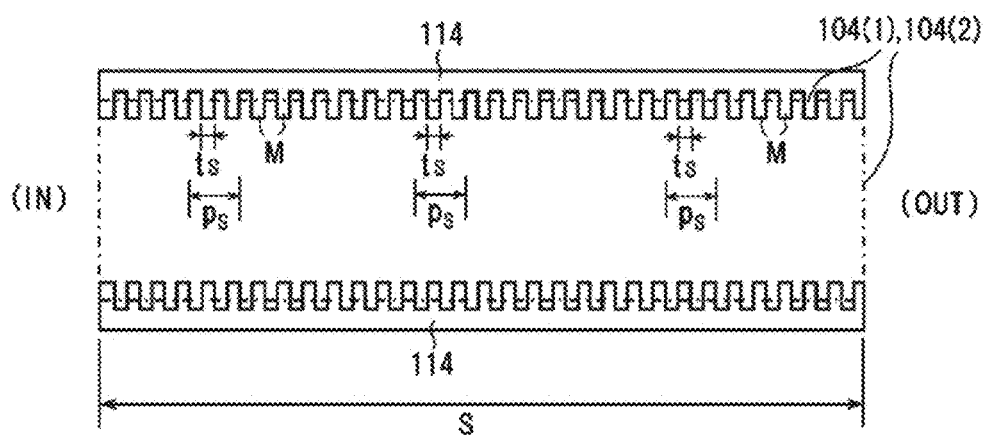
FIG. 7A is a diagram schematically illustrating a layout of comb teeth having a standard thickness that allows a winding pitch (winding gap) of the air core coil to be uniform across the entire length of the coil.
Figure 7B:
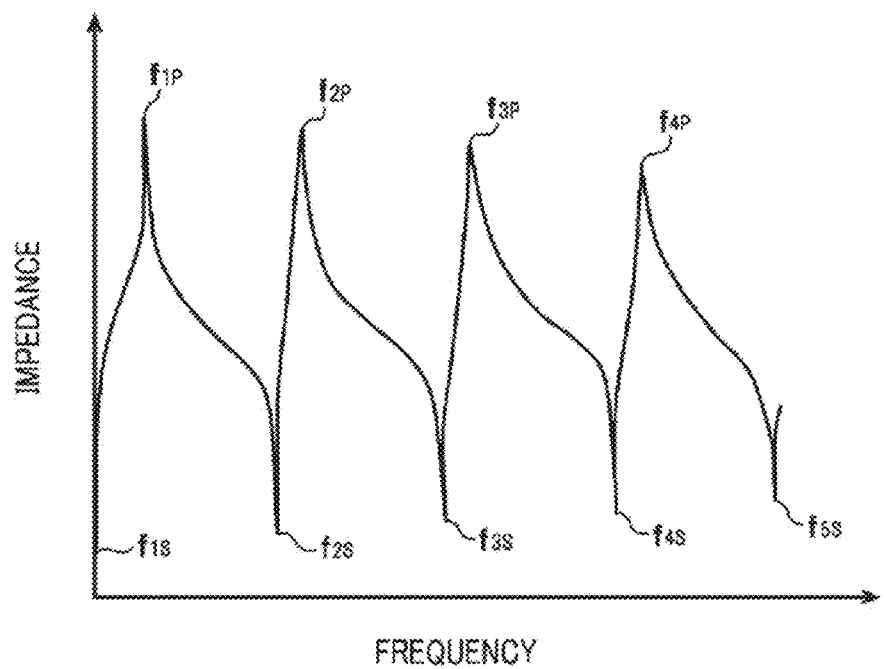
FIG. 7B is a diagram schematically illustrating a frequency-impedance characteristic of multiple parallel resonance obtained in a filter when the comb-teeth member of FIG. 7A is coupled to the air core coil.

In the distributed constant line having the above-described configuration, if the thickness of the comb teeth M is uniform or constant (ts) and the winding pitch is constant (ps) over the entire coil length S of the air core coils 104(1) and 104(2) as shown in FIG. 7A, a frequency-impedance characteristic of multiple parallel resonance in which impedance increases in a conical shape at a regular frequency interval, as shown in FIG. 7B is obtained in each of the filters 102(1) and 102(2). Accordingly, if a frequency of a high frequency noise introduced to the power feed lines 100(1) and 100(2) through the susceptor 12 and the heating element 40 is designed to be equal to or approximate to any one parallel resonance frequency of the multiple parallel resonance, such a high frequency noise can be effectively blocked by the filter unit 54(IN), and the heater power supply 58(IN) can be protected from the high frequency noise stably and securely.

As in the plasma processing apparatus of the example embodiment, however, when multiple high frequency powers (first high frequency power HF and second high frequency power LF) of different frequencies are applied to the susceptor 12, two parallel resonance frequencies of the multiple parallel resonance need to be matched (be equal to or approximate to) with the frequencies of the multiple high frequency powers HF and LF at the same time. In such a case, in the aforementioned filter configuration where the winding pitch p or the winding gap g is uniform or constant over the entire length S of the air core coils 104(1) and 104(2), since the parallel resonance frequencies are obtained at a regular frequency interval, it is very difficult to match the multiple parallel resonance with the frequencies of the two high frequency powers HF and LF at the same time, which are selected in consideration of various aspects such as the kind or specification of a process involved.

To solve this problem, in the prior art described in Patent Document 1, by providing a ring-shaped member between the air core coils 104(1) and 104(2) and the external conductor 110 in the filter unit 54(IN), the gap of the coaxial line is narrowed locally. Accordingly, C (electrostatic capacitance per a unit length) is changed, and, also, the characteristic impedance $Z_0=\sqrt{(L/C)}$ is changed locally. Thus, a part or all of resonance frequencies of the multiple parallel resonance may be shifted.

In contrast, in the present example embodiment, instead of providing such a ring-shaped member, the comb-teeth member 114 in the filter unit 54(IN) is designed to have a first comb tooth M− having a thickness t− that satisfies the condition of t−<ts and a second comb tooth M+ having a thickness t+ that satisfies the condition of ts≤t+. A position of the winding gap p into which each first comb tooth M− is to be inserted and a position of the winding gap g into which each second comb tooth M+ is to be inserted are appropriately selected depending on an order (N) of the resonance frequency of a control (shift) target, a shift direction and a shift amount or a control target value.

Figure 8A:
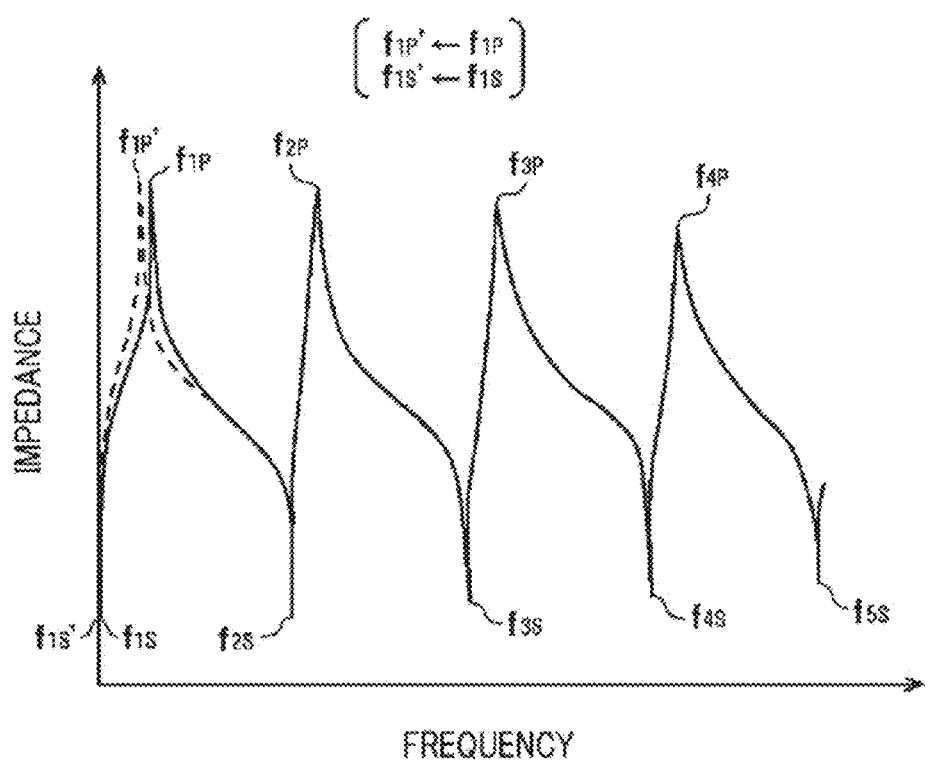
FIG. 8A is a diagram schematically illustrating a control of shifting a first resonance frequency to a lower frequency range.
Figure 8B:
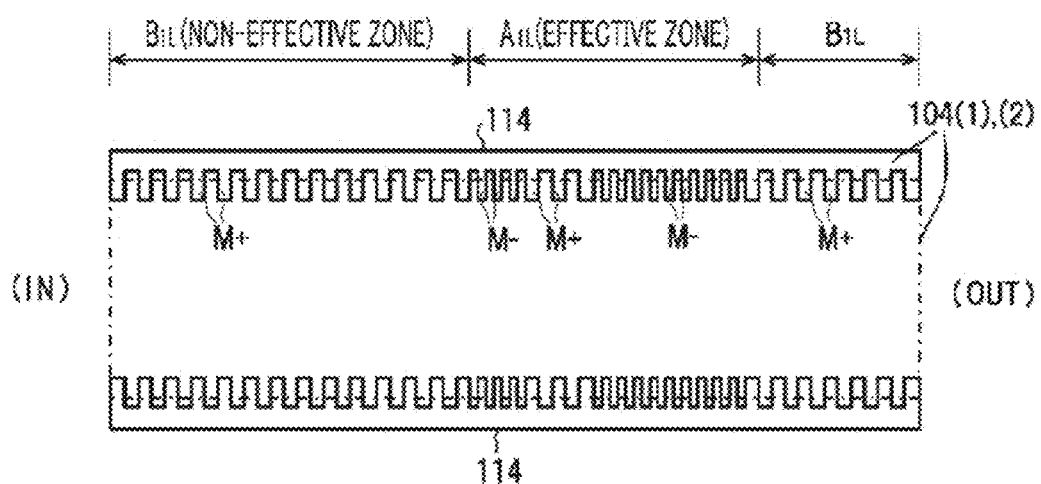
FIG. 8B is a diagram schematically illustrating a distribution of an effective zone in which the left-shift control of FIG. 8A is performed in case that a comb tooth having a thickness smaller than the standard thickness is inserted into a winding gap of the air core coil.

By way of example, as shown in FIG. 8A, a control of shifting first parallel and/or serial resonance frequencies $f_{1P}/f_{1S}$ to a lower frequency range (left direction of the drawing) (hereinafter, referred to as "left-shift control") is assumed. According to the example embodiment, in order to implement the left-shift control for the first resonance frequencies $f_{1P}/f_{1S}$, the first comb teeth M− need to be inserted in a single or multiple winding gaps g within one certain range, i.e., an effective zone $A_{1L}$ extended from the central portion of the air core coils 104(1) and 104(2) to an outlet side (OUT), as shown in FIG. 8B. Further, it is desirable to insert the second comb teeth M+ in all of the winding gaps g within a range other than the effective zone $A_{1L}$, i.e., within a non-effective zone $B_{1L}$. Here, however, by inserting some of the first comb teeth M− within the non-effective zone $B_{1L}$ appropriately, an effect of weakening the effect of the left-shift control, that is, an effect of reducing a left-shift amount is obtained. This effect is the same as in an effective zone $A_{2L}, A_{3L}, \ldots$ and a non-effective zone $B_{2L}, B_{3L}, \ldots$ for second or more resonance frequencies.

In general, if it is assumed that the thickness t− of the first comb teeth M− is uniform, a maximum shift amount can be obtained for the $N^{th}$ parallel and/or serial resonance frequencies $f_{NP}/f_{NS}$ when all the comb teeth M in the effective zone $A_{NL}$ are the first comb teeth M−. Further, within the effective zone $A_{NL}$, the effect of the left-shift control by the first comb teeth M− can be obtained independently for each of the winding gaps g at each position. By selecting the number and/or the combination of the winding gasp g into which the first comb teeth M− are to be inserted within the effective zone $A_{NL}$, the shift amount of the $N^{th}$ resonance frequencies $f_{NP}/f_{NS}$ can be increased or decreased or controlled within a certain range (within the maximum value).

Furthermore, as the thickness t− of each first comb tooth M− decreases (i.e., as a difference from the standard thickness is increases), the effect of the left-shift control (sensitivity or shift amount) tends to be increased. Further, with the decent of the order (N) of the resonance frequency, the effect of the left-shift control by the first comb teeth M− tends to be decreased, whereas with the ascent of the order (N) of the resonance frequency, the effect of the left-shift control by the first comb teeth M− tends to be increased.

Figure 9A:
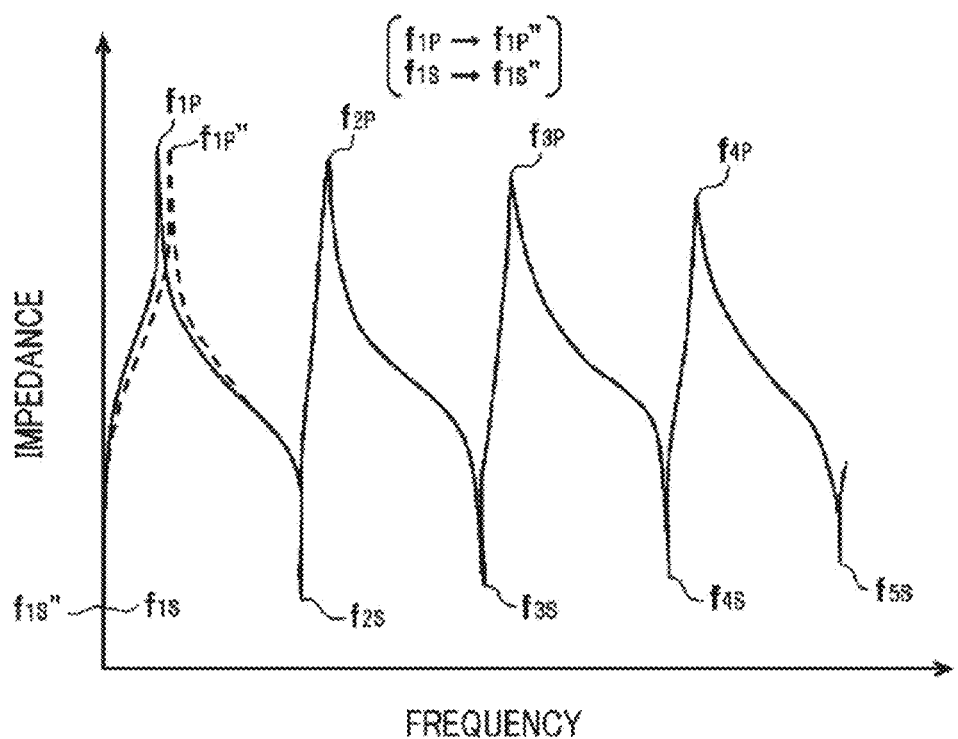
FIG. 9A is a diagram schematically illustrating a control of shifting the first resonance frequency to a higher frequency range.
Figure 9B:
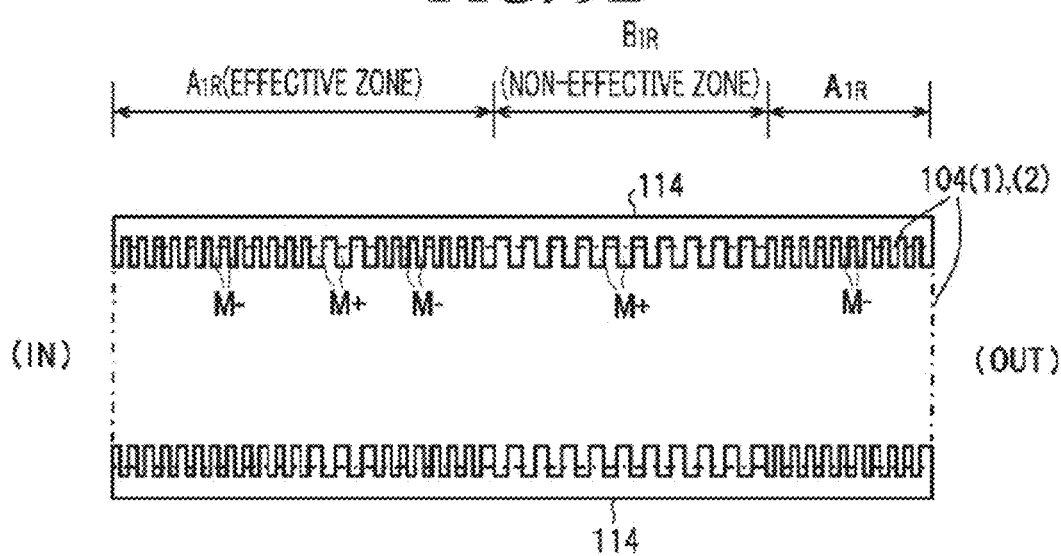
FIG. 9B is a diagram schematically illustrating a distribution of an effective zone in which the right-shift control of FIG. 9A is performed.

On the contrary, as depicted in FIG. 9A, a control of shifting the first resonance frequencies $f_{1P}/f_{1S}$ to a higher frequency range (right direction of the drawing) (hereinafter, referred to as "right-shift control") is assumed. According to the example embodiment, in the right-shift control of the first resonance frequencies $f_{1P}/f_{1S}$, a positional relationship between an effective zone A where a right-shift control effect is obtained by the first comb teeth M− and a non-effective zone B other than the effective zone A is reversed to that in case of the left-shift control (FIG. 8B), and there exist two effective zones $A_{1R}$ at both end portions of the coils, as shown in FIG. 9B. As in this case, that is, in case that the effective zones $A_{1R}$ exist at multiple positions, a constant shift effect, irrespective of the degree of the effect, can be obtained if the first comb teeth M− are inserted into at least one winding gap g within at least one effective zone $A_{1R}$. Further, it is desirable to insert the second comb teeth M+ in all of the winding gaps g within the non-effective zone $B_{1R}$ in the central portion. Here, however, by inserting some of the first comb teeth M− within the non-effective zone $B_{1R}$, an effect of weakening the effect of the right-shift control, that is, an effect of reducing a right-shift amount is obtained. This effect is the same as in effective zones $A_{2R}$, $A_{3R}$, ... and non-effective zones $B_{2R}$, $B_{3R}$, ... for the second or more-order resonance frequencies.

In the right-shift control, generally, if it is assumed that the thickness t− of the first comb teeth M− is uniform, a maximum shift amount can be obtained for the $N^{th}$ resonance frequencies $f_{NP}/f_{NS}$ when all the comb teeth M within the effective zones $A_{NR}$ are the first comb teeth M−. Further, even within the effective zones $A_{NR}$, the effect of the right-shift control by the first comb teeth M− can be obtained independently in each of the winding gaps g at each position. By selecting the number and/or the combination of the winding gaps g into which the first comb teeth M− are to be inserted within the effective zone $A_{NR}$, the shift amount can be increased or decreased or controlled within a certain range (equal to or less than the maximum value).

Furthermore, as the thickness t− of each first comb tooth M− decreases (i.e., as the difference from the standard thickness is increases), the effect of the right-shift control tends to be increased. Further, with the decent of the order (N) of the resonance frequency, the effect of the right-shift control by the first comb teeth M− tends to be decreased, whereas with the ascent of the order (N) of the resonance frequency, the effect of the right-shift control by the first comb teeth M− tends to be increased.

Figure 10A:
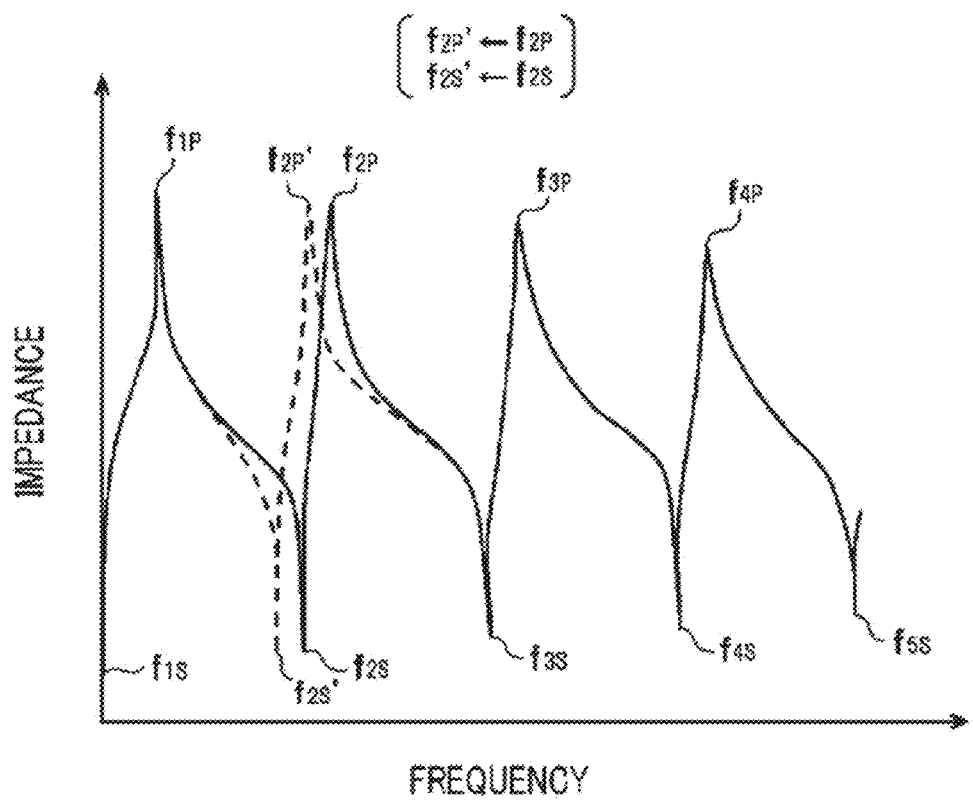
FIG. 10A is a diagram schematically illustrating a control of shifting a second resonance frequency to a lower frequency range.
Figure 10B:
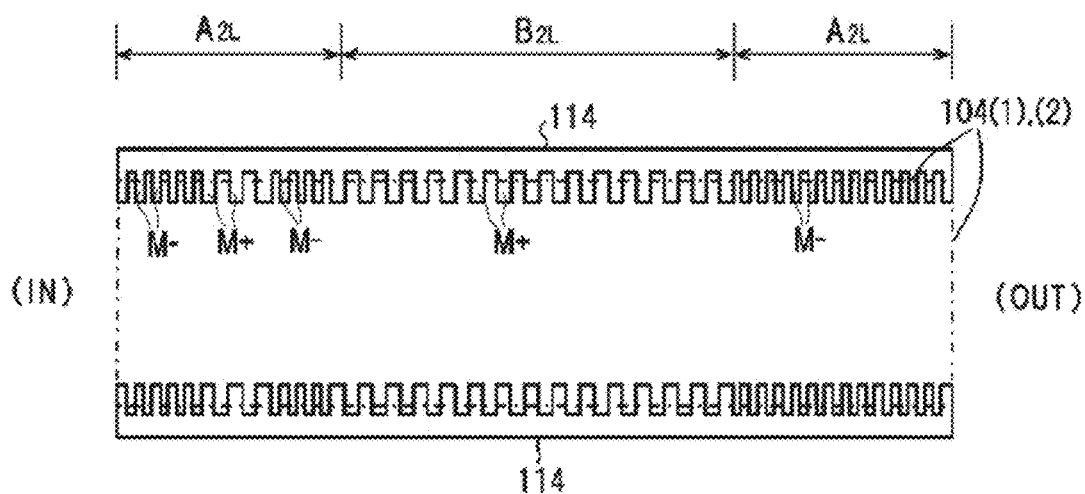
FIG. 10B is a diagram schematically illustrating a distribution of an effective zone in which the left-shift control of FIG. 10A is performed.

Now, as shown in FIG. 10A, the left-shift control for second parallel and/or serial resonance frequencies $f_{2P}/f_{2S}$ is assumed. In this case, as illustrated in FIG. 10B, two effective zones $A_{2L}$ exist at both sides or both end portions of the air core coils 104(1) and 104(2) except a central portion thereof. Accordingly, if the first comb teeth M− are inserted into one or more winding gaps g within at least one effective zone $A_{2L}$, a left-shift control effect can be obtained. By selecting the number and/or the combination of the winding gaps g into which the first comb teeth M− are to be inserted within the two effective zones $A_{2L}$, a left-shift amount of the second resonance frequencies $f_{2P}/f_{2S}$ can be increased or decreased or controlled within a certain range (equal to or less than the maximum value).

Figure 11A:
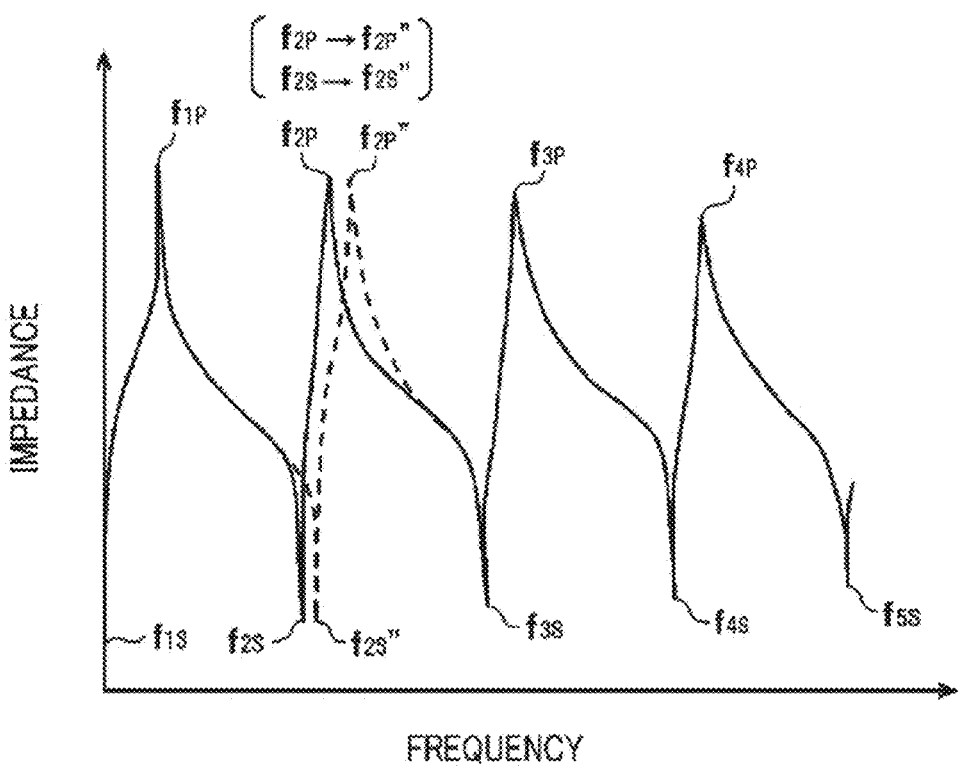
FIG. 11A is a diagram schematically illustrating a control of shifting the second resonance frequency to a higher frequency range.
Figure 11B:
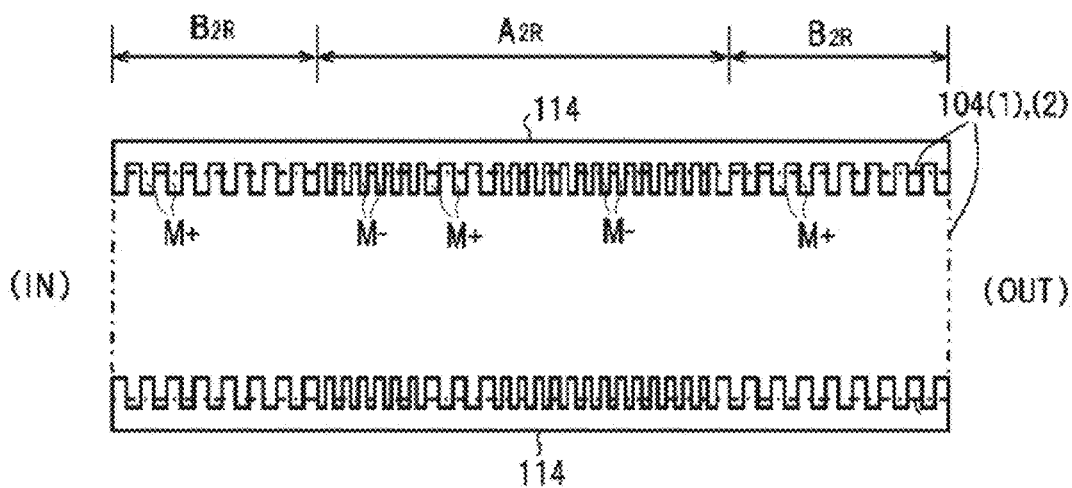
FIG. 11B is a diagram schematically illustrating a distribution of an effective zone in which the right-shift control of FIG. 11A is performed.

As depicted in FIG. 11A, in the right-shift control for the second resonance frequencies $f_{2P}/f_{2S}$, a positional relationship between an effective zone A and a non-effective zone B is reversed to that in case of the left-shift control (FIG. 10B), and a single effective zone $A_{2R}$ exists at a central portion of the coils, as shown in FIG. 11B. Accordingly, by selecting the number and/or the combination of winding gaps g into which the first comb teeth M− are to be inserted within the single effective zones $A_{2R}$, a right-shift amount of the second resonance frequencies $f_{2P}/f_{2S}$ can be increased or decreased or controlled within a certain range (equal to or less than the maximum value).

Figure 12A:
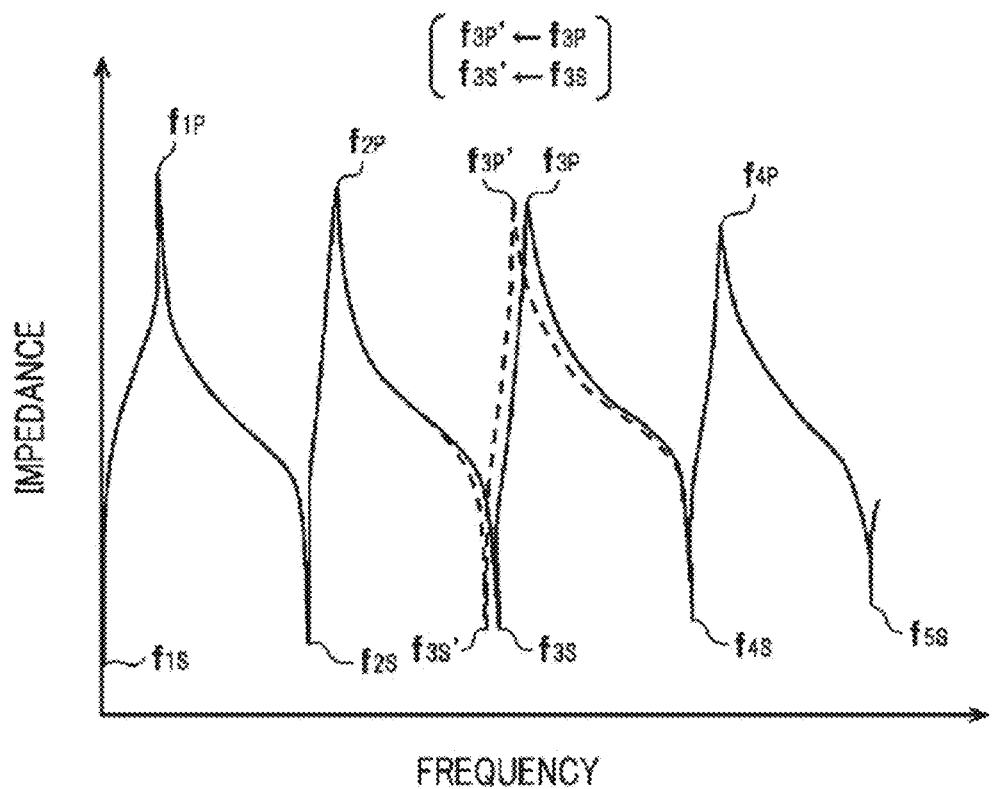
FIG. 12A is a diagram schematically illustrating a control of shifting a third resonance frequency to a lower frequency range.
Figure 12B:
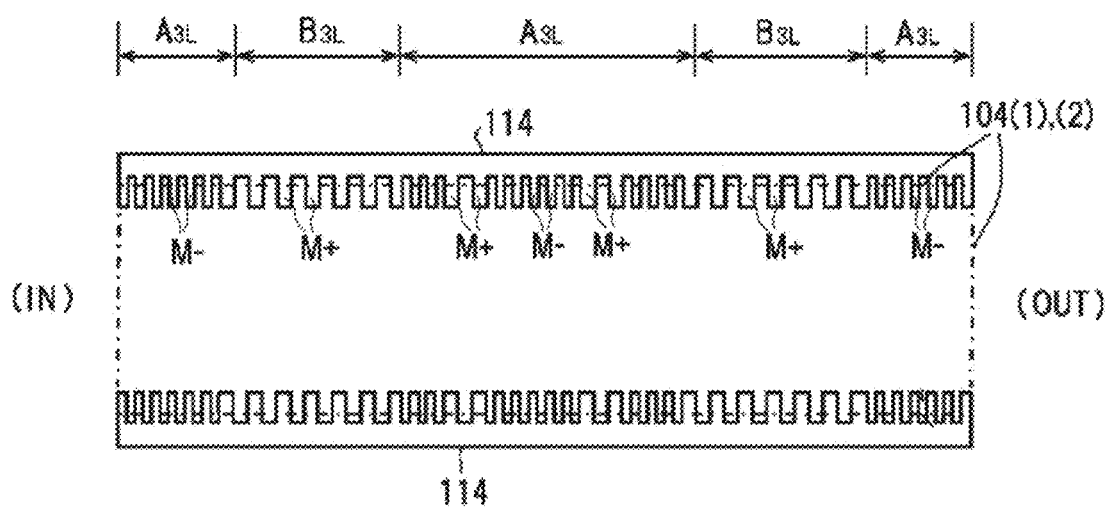
FIG. 12B is a diagram schematically illustrating a distribution of an effective zone in which the left-shift control of FIG. 12A is performed.

Now, as depicted in FIG. 12A, the left-shift control for third parallel and/or serial resonance frequencies $f_{3P}/f_{3S}$ is assumed. In this case, three separate effective zones $A_{3L}$ exist at positions including a central portion and both end portions of the air core coils 104(1) and 104(2), as shown in FIG. 12B. Accordingly, by selecting the number and/or the combination of winding gaps g into which the first comb teeth M− are to be inserted within all of these three effective zones $A_{3L}$, a left-shift amount of the third resonance frequencies $f_{3P}/f_{3S}$ can be increased or decreased or controlled within a certain range.

Figure 13A:
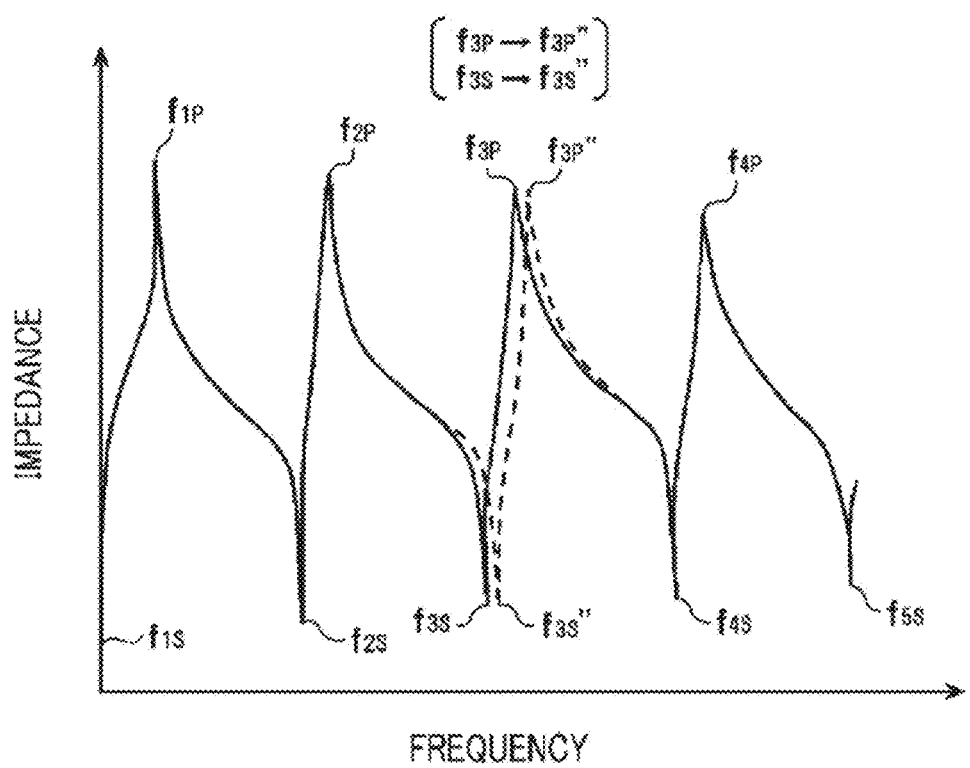
FIG. 13A is a diagram schematically illustrating a control of shifting the third resonance frequency to a higher frequency range.
Figure 13B:
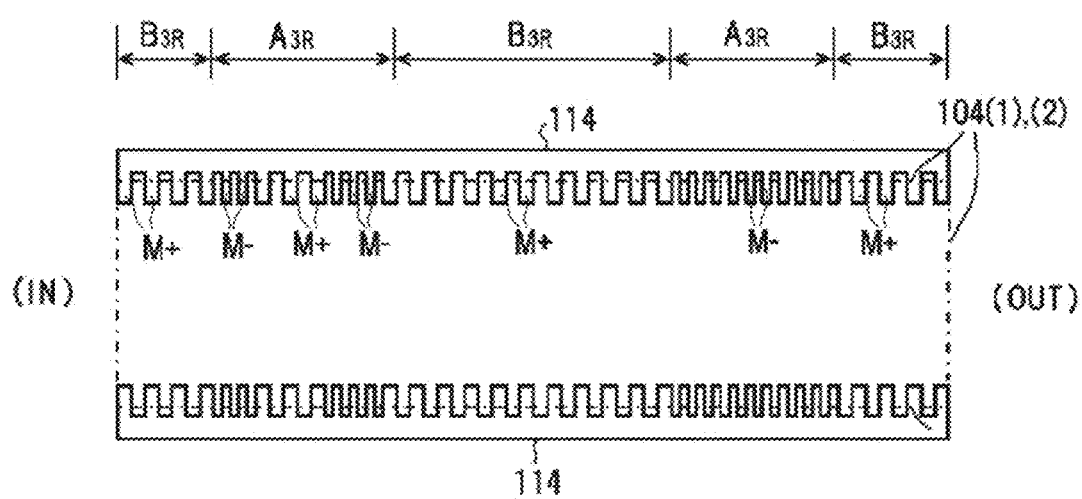
FIG. 13B is a diagram schematically illustrating a distribution of an effective zone and a non-effective zone in which the right-shift control of FIG. 13A is performed.

Further, referring to FIG. 13A, in the right-shift control for the third parallel and/or serial resonance frequencies $f_{3P}/f_{3S}$, a positional relationship between an effective zone A and a non-effective zone B is reversed to that in case of the left-shift control (FIG. 12B), and two effective zones $A_{3R}$ exist at two intermediate positions between the central portion and both end portions of the coils, as shown in FIG. 13B. By selecting the number and/or the combination of winding gaps g into which the first comb teeth M− are to be inserted within all of these two effective zones $A_{3R}$, a right-shift amount of the third resonance frequencies $f_{3P}/f_{3S}$ can be increased or decreased or controlled within a certain range.

Figure 14A:
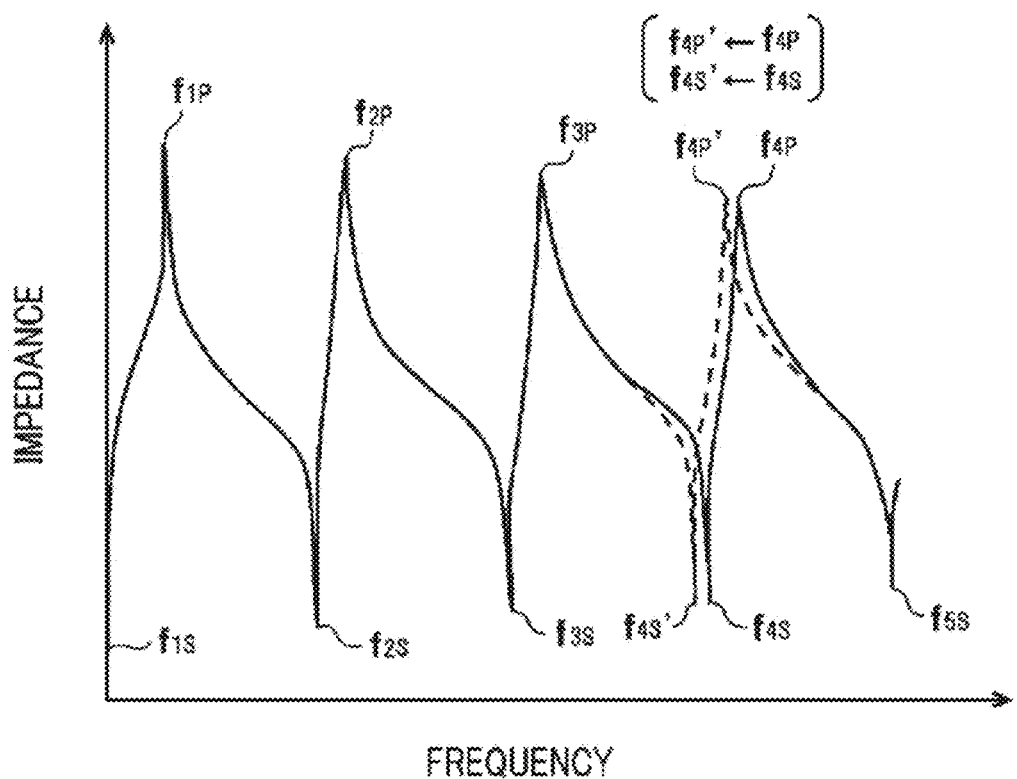
FIG. 14A is a diagram schematically illustrating a control of shifting a fourth resonance frequency to a lower frequency range.
Figure 14B:
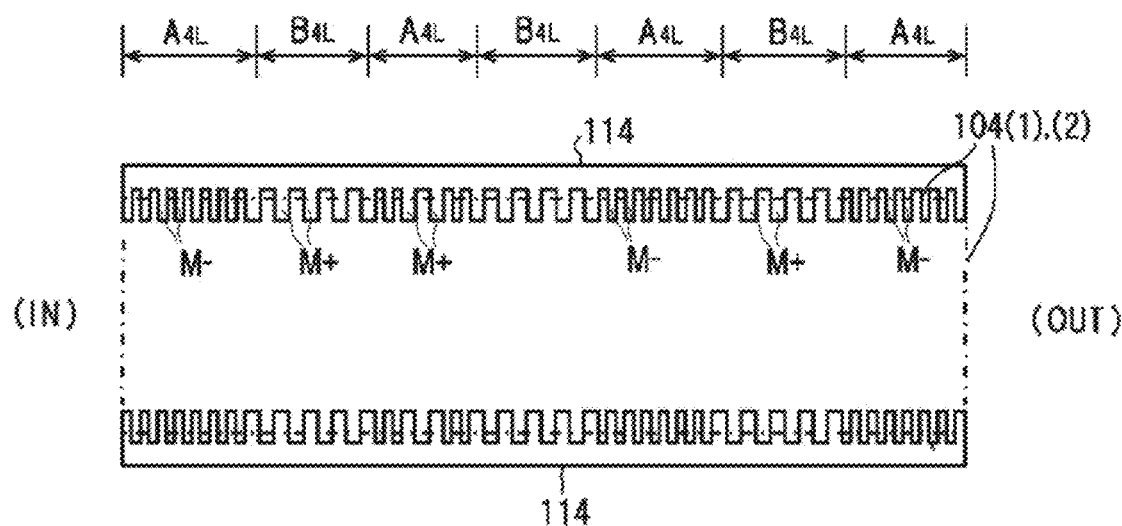
FIG. 14B is a diagram schematically illustrating a distribution of an effective zone in which the left-shift control of FIG. 14A is performed.

Now, referring to FIG. 14A, in the left-shift control for fourth parallel and/or serial resonance frequencies $f_{4P}/f_{4S}$, four separate effective zones $A_{4L}$ exist at positions including both end portions of the air core coils 104(1) and 104(2), as illustrated in FIG. 14B. Accordingly, by selecting the number and/or the combination of winding gaps g into which the first comb teeth M− are to be inserted within all of these four effective zones $A_{4L}$, a left-shift amount of the fourth resonance frequencies $f_{4P}/f_{4S}$ can be increased or decreased or controlled within a certain range.

Figure 15A:
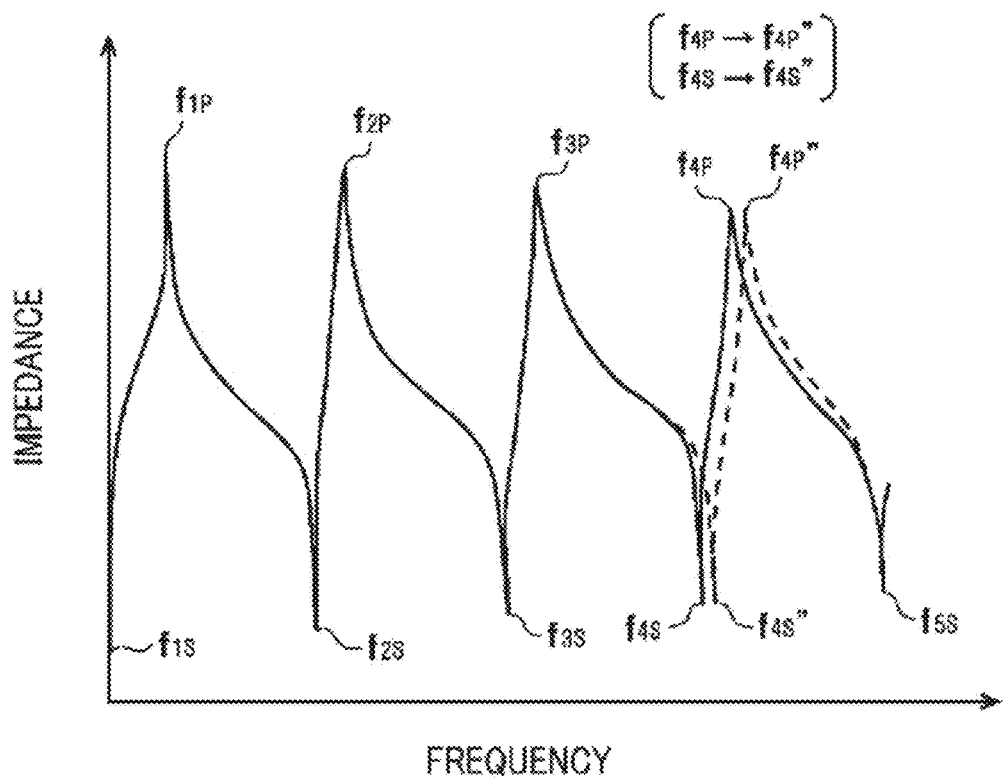
FIG. 15A is a diagram schematically illustrating a control of shifting the fourth resonance frequency to a higher frequency range.
Figure 15B:
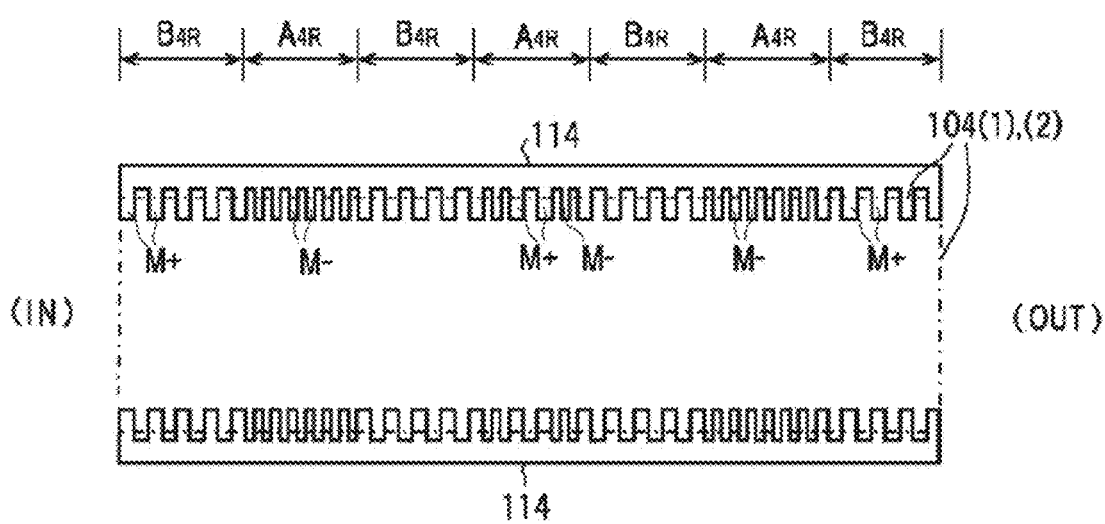
FIG. 15B is a diagram schematically illustrating a distribution of an effective zone in which the right-shift control of FIG. 15A is performed.

Further, referring to FIG. 15A, in the right-shift control for the fourth parallel and/or serial resonance frequencies $f_{4P}/f_{4S}$, a positional relationship between an effective zone A and a non-effective zone B is reversed to that in case of the left-shift control (FIG. 14B), and three separate effective zones $A_{4R}$ exist at positions including a central portion and excluding both end portions of the coils, as shown in FIG. 15B. By selecting the number and/or the combination of winding gaps g into which the first comb teeth M− are to be inserted within all of these three effective zones $A_{4R}$, a right-shift amount of the fourth resonance frequencies $f_{4P}/f_{4S}$ can be increased or decreased or controlled within a certain range.

Further, in the present example embodiment, the left-shift control or the right-shift control can be performed for different resonance frequencies independently.

Figure 16A:
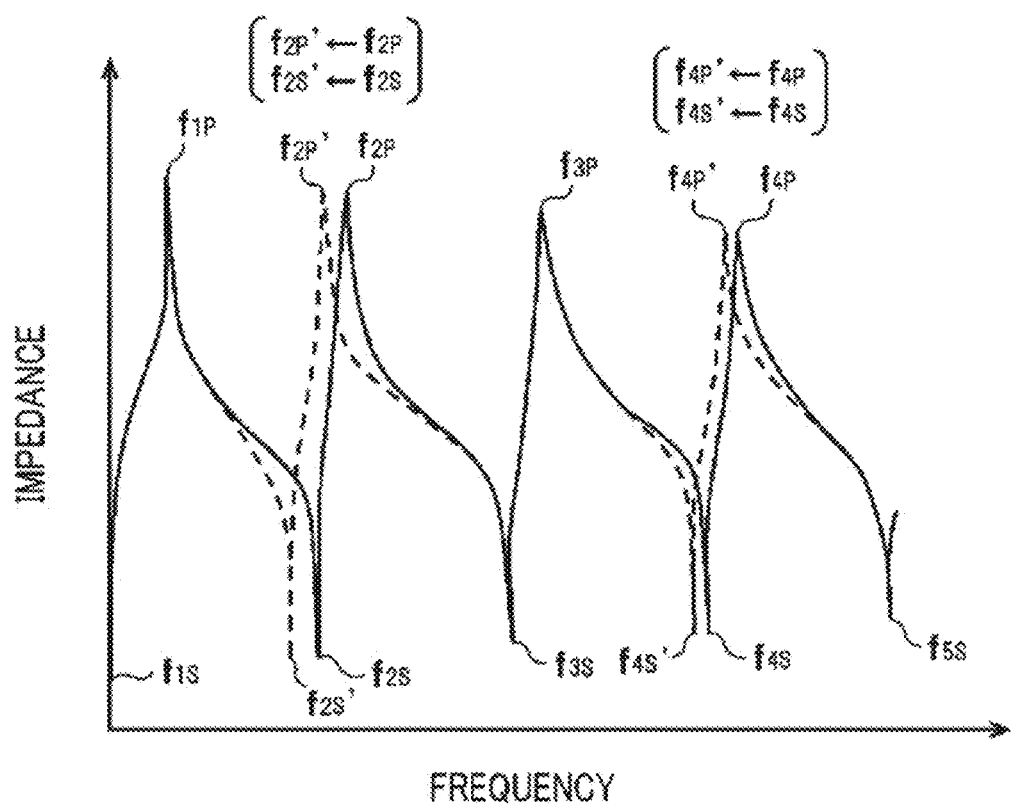
FIG. 16A is a diagram schematically illustrating a control of shifting each of the second resonance frequency and the fourth resonance frequency to a lower frequency range.
Figure 16B:
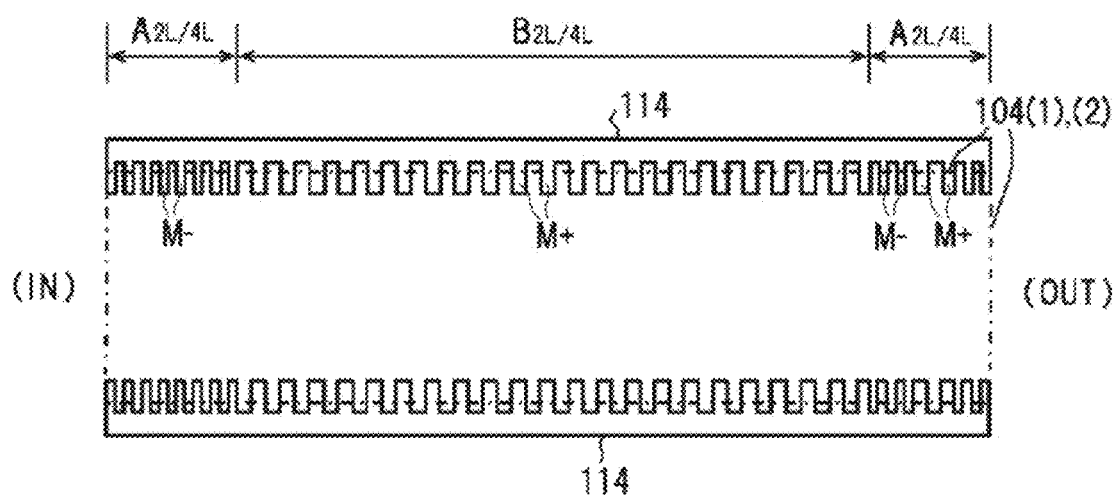
FIG. 16B is a diagram schematically illustrating a distribution of an effective zone in which the left-shift control of FIG. 16A is performed.

As one example, referring to FIG. 16A, a case of performing the left-shift control for the second resonance frequencies $f_{2P}/f_{2S}$ and the fourth resonance frequencies $f_{4P}/f_{4S}$ is assumed. In this case, if the distribution (FIG. 10B) of the effective zones $A_{2L}$ for the left-shift control of the second resonance frequencies $f_{2P}/f_{2S}$ and the distribution (FIG. 14B) of the effective zones $A_{4L}$ for the left-shift control of the fourth resonance frequencies $f_{4P}/f_{4S}$ are overlapped under "AND" condition, two effective zones $A_{2L/4L}$ exist at both end portions of the coils, as shown in FIG. 16B. By selecting the number and/or the combination of winding gaps g into which the first comb teeth M− are to be inserted within all of these two effective zones $A_{2L/4L}$, left-shift amounts of the second resonance frequencies $f_{2P}/f_{2S}$ and the fourth resonance $f_{4P}/f_{4S}$ can be increased or decreased or controlled within a certain range.

Figure 17A:
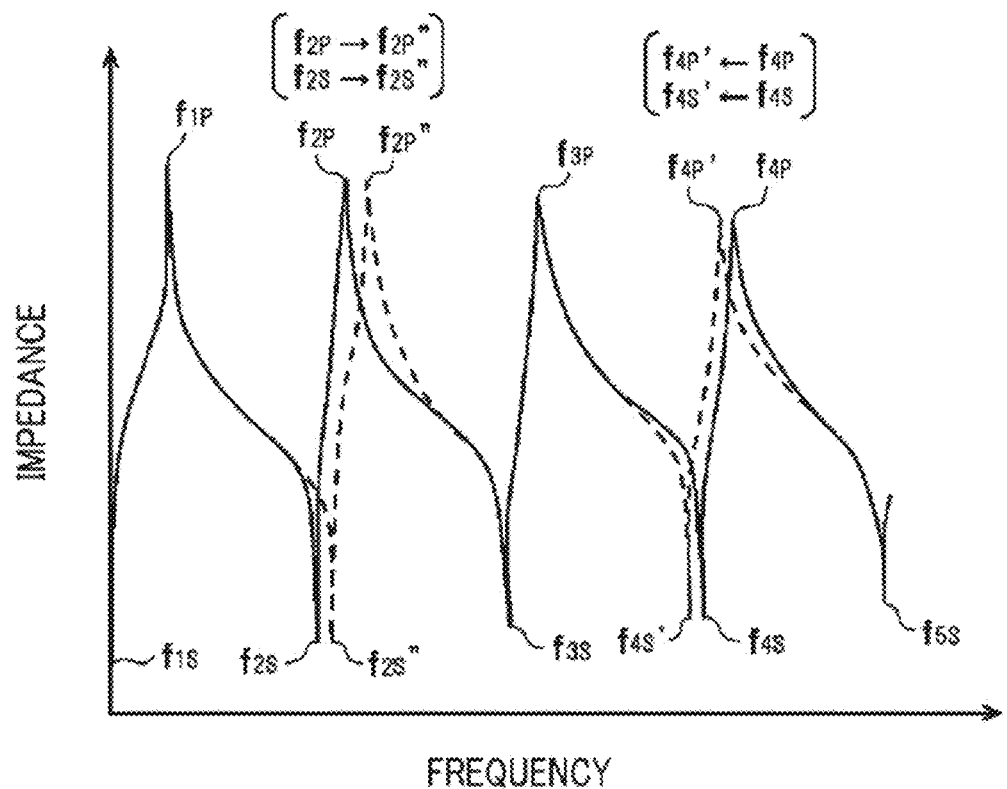
FIG. 17A is a diagram schematically illustrating a control of shifting the second resonance frequency to a higher frequency range and the fourth resonance frequency to a lower frequency range.
Figure 17B:
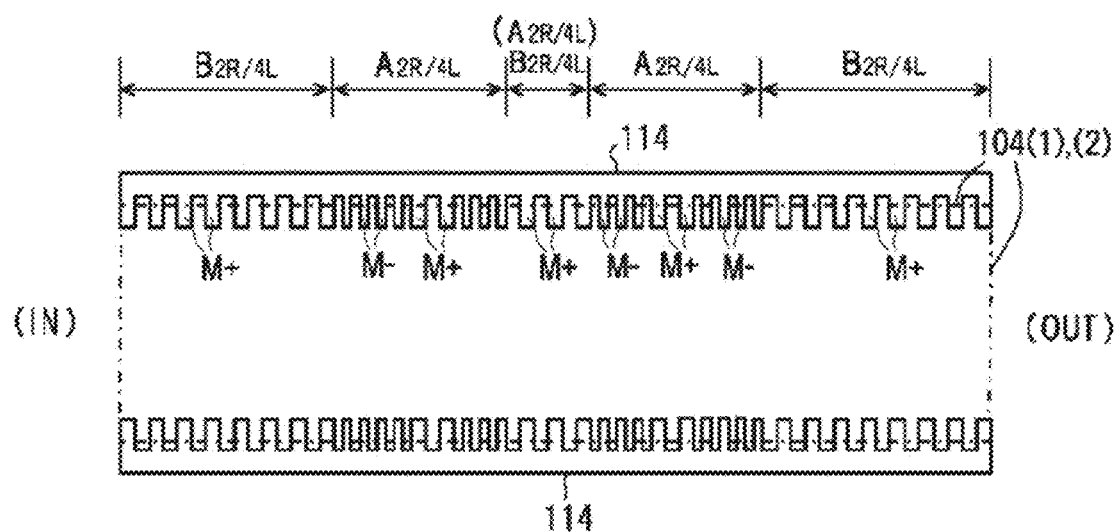
FIG. 17B is a diagram schematically illustrating a distribution of an effective zone in which the right-shift control of FIG. 17A is performed.

As another example, referring to FIG. 17A, a case of performing the right-shift control for the second resonance frequencies $f_{2P}/f_{2S}$ and the left-shift control for the fourth resonance frequencies $f_{4P}/f_{4S}$ is assumed. In this case, if the distribution (FIG. 11B) of the effective zones $A_{2R}$ for the right-shift control of the second resonance frequencies $f_{2P}/f_{2S}$ and the distribution (FIG. 14B) of the effective zones $A_{4L}$ for the left-shift control of the fourth resonance frequencies $f_{4P}/f_{4S}$ are overlapped under "AND" condition, effective zones $A_{2R/4L}$ exist at two separate positions except a central portion and both end portions of the coils, as shown in FIG. 17B. By selecting the number and/or the combination of winding gaps g into which the first comb teeth M− are to be inserted within all of these two effective zones $A_{2R/4L}$, a right-shift amount of the second resonance frequencies $f_{2P}/f_{2S}$ and a left-shift amount of the fourth resonance frequencies $f_{4P}/f_{4S}$ can be increased or decreased or controlled within a certain range.

When performing the independent shift controls for the different resonance frequencies, there is a winding gap g where an original effective zone A and an original non-effective zone B are overlapped. By way of example, in the example shown in FIG. 17A, there is a winding gap g that belongs to the effective zone $A_{2R}$ when performing the right-shift control for only the second resonance frequencies $f_{2P}/f_{2S}$ and belongs to the effective zone $A_{4L}$ when performing the left-shift control for only the fourth resonance frequencies $f_{4P}/f_{4S}$. When overlapping the distributions of the effective zones as stated above under the "AND" condition, this winding gap g belongs to a non-effective zone $B_{2R/4L}$.

However, in case that the right-shift control of the second resonance frequencies $f_{2P}/f_{2S}$ has priority over the left-shift control of the fourth resonance frequencies $f_{4P}/f_{4S}$, for example, this winding gap g may be set as the effective zone $A_{2R/4L}$. Accordingly, in the arrangement pattern of FIG. 17B, a central range set as the non-effective zone $B_{2R/4L}$ can be changed to the effective zone $A_{2R/4L}$ (see FIG. 25A).

As stated above, in accordance with the example embodiment, by providing the comb-teeth member 114 to the air core coils 104(1) and 104(2), that is, by inserting either one of the first comb tooth M− having the thickness t− satisfying the condition of t−<ts and the second comb tooth M+ having the thickness t+ satisfying the condition of ts≤t+ into each winding gap g of the air core coils 104(1) and 104(2) and by arranging at least one first comb tooth M− within one or more effective zones A that are provided separately in the lengthwise direction of the air core coils 104(1) and 104(2), it is possible to conduct the left-shift control or the right-shift control for the $N^{th}$ parallel and/or serial resonance frequencies $f_{NP}/f_{NS}$ at a preset shift amount within a preset range. Here, since the distribution of the effective zones A is patterned for each of the $N^{th}$ resonance frequencies $f_{NP}/f_{NS}$ as stated above (FIG. 8B, FIG. 9B, . . . , FIG. 17B), it is possible to design and manufacture the comb-teeth M of the comb-teeth members 114 based on these basic patterns.

However, as described above, since the shift-control effect by the first comb tooth M− within the effective zone A is exerted in each winding gap g independently, actually, it is desirable to measure a shift control effect by inserting the first comb tooth M− into each winding gap g using sample or actual air core coils 104(1) and 104(2) and to create a database regarding presence/absence of a shift, a shift direction and a shift amount for each wining gap g.

Figure 18A:
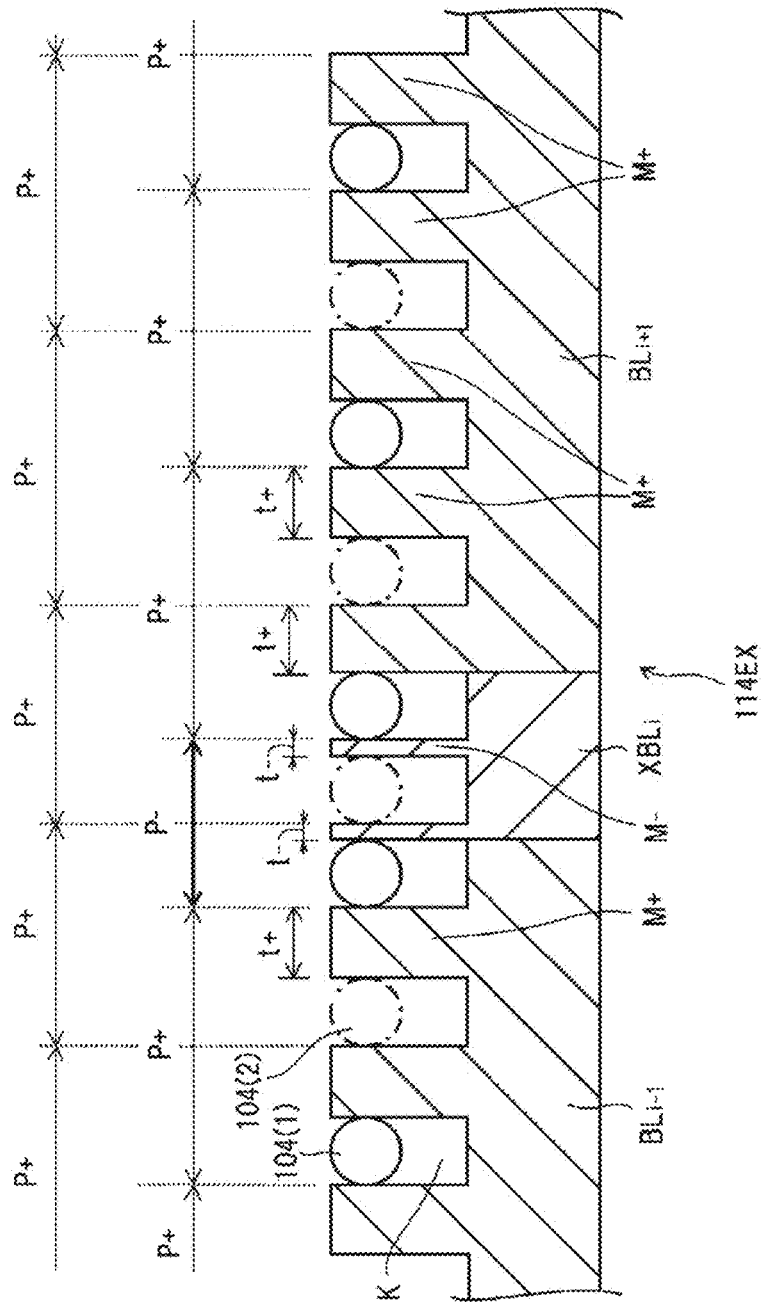
FIG. 18A is a diagram illustrating a comb-teeth member for testing which includes an inspection block of a single winding gap.
Figure 18B:
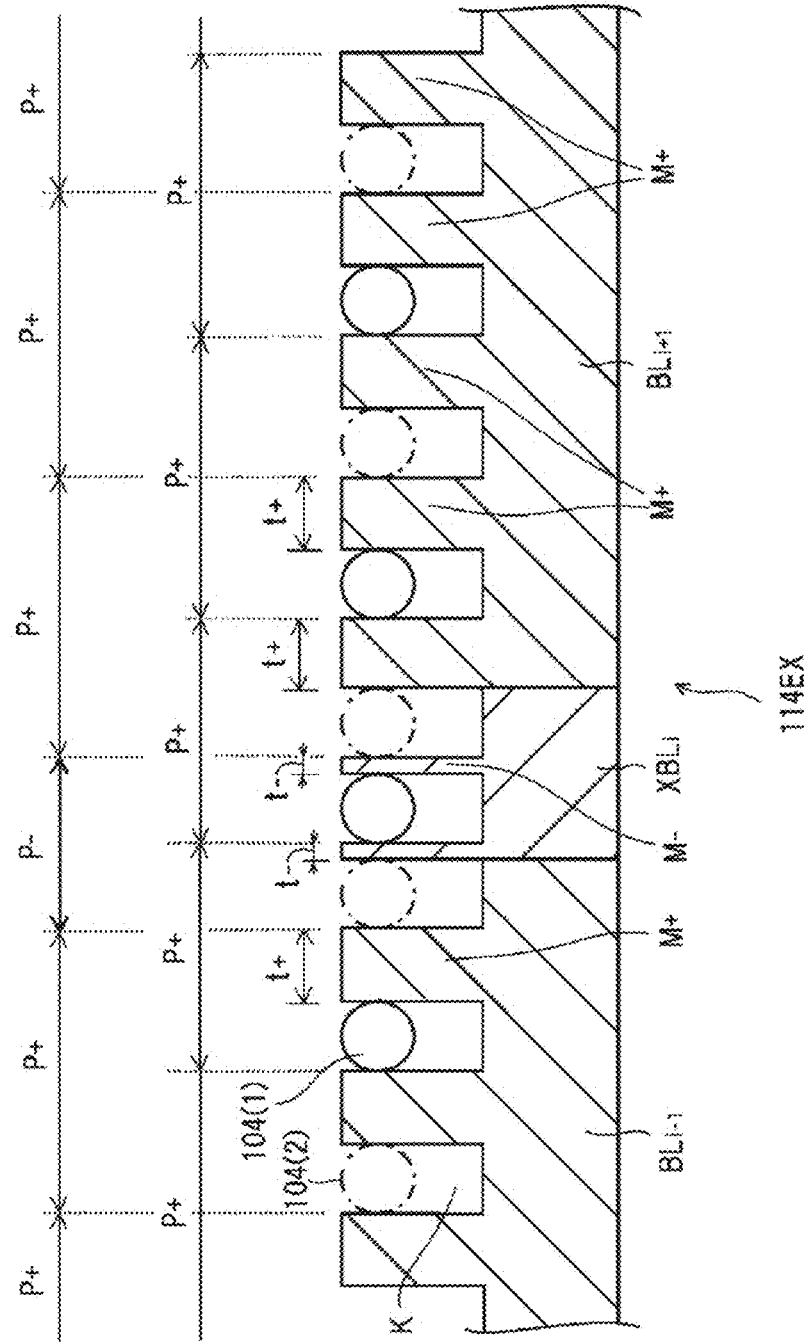
FIG. 18B is a diagram illustrating the opposite side (which is in a point symmetry) from FIG. 18A.

To elaborate, by using the block combination structure (FIG. 5B), a comb-teeth member 114EX for testing is assembled by combining a single inspection block $XBL_i$ having the first comb tooth M− for satisfying the condition of p−<ps (g−<gs) only in several consecutive winding pitches (i.e., winding gaps) (most desirably, only one winding gap) and a single or a multiple number of blocks ( . . . , $BL_{i-1}$, $BL_{i+1}$, . . . ) having the second comb tooth M+ for satisfying the condition of ps≤p+(gs≤g+) in all winding pitches (winding gaps), as shown in FIG. 18A and FIG. 18B. Further, the inspection block $XBL_i$ in FIG. 18A and the inspection block $XBL_i$ in FIG. 18B are positioned opposite to each other (in a point symmetry) with respect to a central axis line of the air core coils 104(1) and 104(2), that is, spaced apart from each other by 180° in a circumferential direction.

First, the comb-teeth member 114EX for testing, in which the inspection block $XBL_i$ is positioned at the head thereof, is coupled to the air core coils 104(1) and 104(2). A frequency-impedance characteristic of either one of the filters 102(1) and 102(2) is acquired by an impedance analyzer or a network analyzer, and the respective $N^{th}$ resonance frequencies $f_{NP}/f_{NS}$ are measured. Then, measurement values of the $N^{th}$ resonance frequencies $f_{NP}/f_{NS}$ are compared with measurement values of the $N^{th}$ resonance frequencies $f_{NP}/f_{NS}$ obtained when the standard wining gap gs or winding pitch ps is used, i.e., are compared with comparison reference values. Then, the presence/absence of the shift, the shift direction and the shift amount are calculated.

Figure 19:
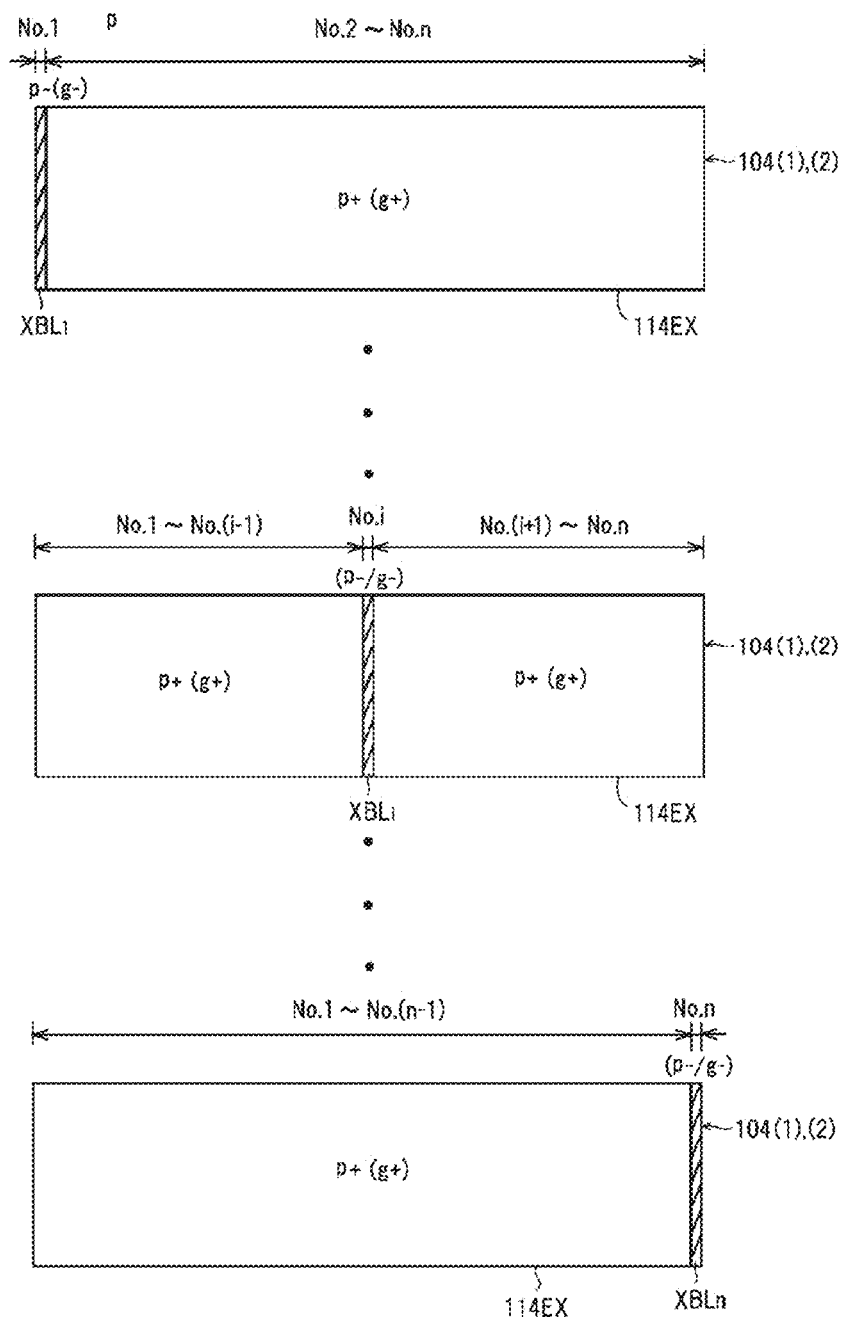
FIG. 19 is a diagram showing a method of investigating presence/absence of a shift, a shift direction and a shift amount of the resonance frequency for each winding gap by sequentially changing a position of the inspection block of the comb-teeth member on a unit of a single gap.

As depicted in FIG. 19, the arrangement position of the inspection block $XBL_i$ is moved from a leading end of the air core coils 104(1) and 104(2) to a termination end thereof by every single unit (in this example, a unit of a single winding gap), and the above-described experiment is repeatedly performed as many times as the number n of winding gaps from a (No. 1) winding gap g at the head to a (No. n) winding gap g at the end (i=1, 2, . . . , n). Measurement data of the presence/absence of the shift, the shift direction and the shift amount in case of inserting the first comb tooth M− into each winding gap g of the air core coils 104(1) and 104(2) are acquired, and a database can be created.

Accordingly, for the filter unit 54(IN) and the filters 102(1) and 102(2), a trial product or an actual product of the comb-teeth member 114, in which the first comb teeth M− and the second comb teeth M+ coexist in an optimum distribution pattern, can be fabricated as a single-forming structure (FIG. 5A) or as a block-assembly structure (FIG. 5B) such that the required shift amount in a required shift direction is obtained for the preset one or the respective $N^{th}$ parallel and/or serial resonance frequencies $f_{NP}/f_{NS}$ based on the database.

EXPERIMENTAL EXAMPLES

Figure 20A:
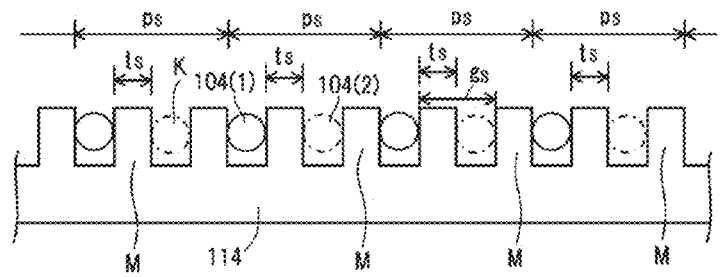
FIG. 20A is a diagram schematically illustrating a layout of comb teeth having the standard thickness that allows the winding gaps of the air core coil over the entire length of the coil to be uniform in accordance with an experimental example.
Figure 20B:
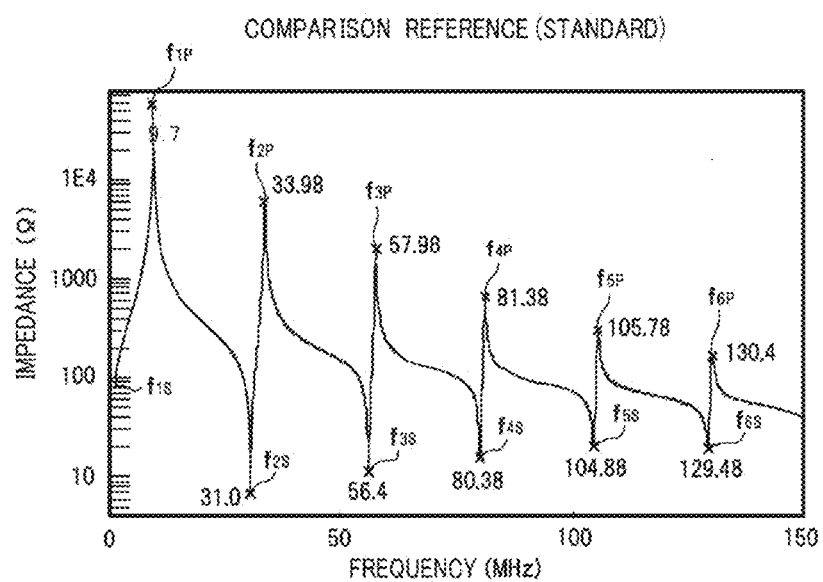
FIG. 20B is a diagram showing a frequency-impedance characteristic (standard characteristic) of multiple parallel resonance of a filter obtained by coupling the comb-teeth member of FIG. 20A to the air core coil in the above experimental example.

The present inventors have conducted an experiment to verify the technical concept and techniques of the above-described example embodiment. In this experiment, the air core coils 104(1) and 104(2), each having an inner diameter of 50 mm, an outer diameter of 62 mm, a winding number of 31 turns, a coil conductor thickness k of 1 mm, an air core coils 104(1) and 104(2) having a coil length S of 124 mm, are used. As shown in FIG. 20A, the comb-teeth member 114, in which the comb teeth M having the standard thickness is (1 mm) are provided and a uniform winding pitch ps (4 mm) in the entire range from one end of the coils to the other ends thereof is obtained, is coupled to the air core coils 104(1) and 104(2), and a frequency-impedance characteristic of one filter unit 102(1) is acquired by using the impedance analyzer. FIG. 20B shows a comparison reference (standard) frequency-impedance characteristic.

That is, first to sixth parallel resonance frequencies $f_{1P}$ to $f_{6P}$ are as follows: $f_{1P}$=9.7 MHz, $f_{2P}$=33.98 MHz, $f_{3P}$=57.98 MHz, $f_{4P}$=81.38 MHz, $f_{5P}$=105.78 MHz, and $f_{6P}$=130.4 MHz. Further, second to sixth serial resonance frequencies $f_{2S}$ to $f_{6S}$ are as follows: $f_{2S}$=31.0 MHz, $f_{3S}$=56.4 MHz, $f_{4S}$=80.38 MHz, $f_{5S}$=104.88 MHz, and $f_{6S}$=129.48 MHz.

Figure 21A:
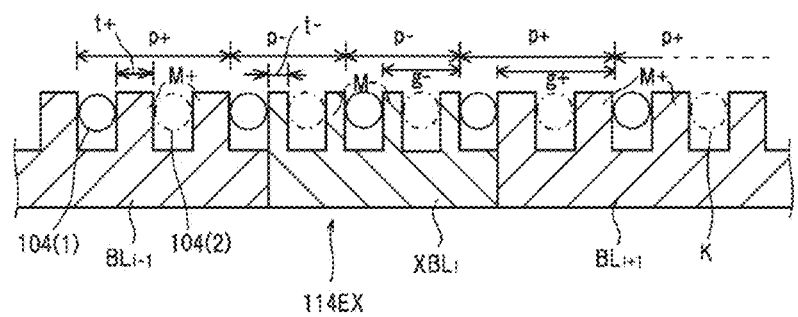
FIG. 21A is a diagram illustrating an assembly structure of a comb-teeth member for investigating the presence/absence of the shift, the shift direction and the shift amount of each resonance frequency in a case where first comb teeth are inserted in every second winding gap in the above experimental example.

In this verification experiment, there is used a single inspection block $XBL_i$ having, only in two consecutive winding pitches p (i.e., two consecutive winding gaps p), comb teeth M− of a thickness t− (0.5 mm) satisfying the condition of p−<ps (g−<gs), as shown in FIG. 21A. A comb-teeth member 114EX for testing is assembled by combining this inspection block $XBL_i$ and a single or a multiple number of blocks ( . . . , $BL_{i-1}$, $BL_{i+1}$, . . . ) having comb teeth M+ of a thickness t+ (1 mm) satisfying the condition of ps≤p+(gs≤g+) in all winding pitches (winding gaps).

Figure 21B:
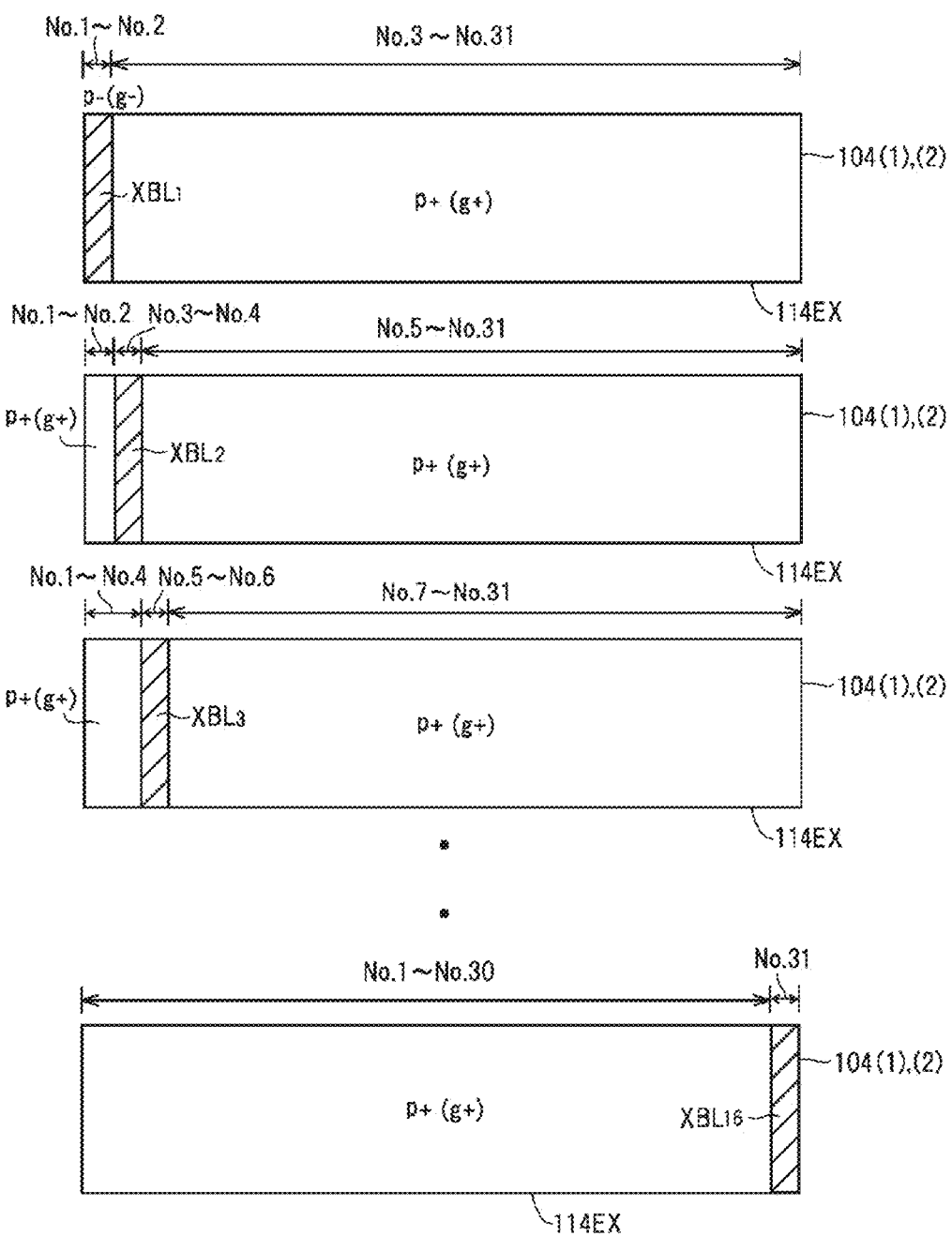
FIG. 21B is a diagram illustrating a method of investigating the presence/absence of the shift, the shift direction and the shift amount of the resonance frequency for each winding gap in the case where the first comb teeth are inserted in every second winding gap in the above experimental example.

As depicted in FIG. 21B, the above-described experiment is repeatedly performed while moving the arrangement position of the inspection block $XBL_i$ from a No. 1 winding gap at the leading end of the air core coils 104(1) and 104(2) to a No. 31 winding gap at the end thereof by a unit of every two gaps (2 g). Then, the presence/absence of the shift, the shift direction and the shift amount are measured for the case where the first comb teeth M− are inserted only in respective two winding gaps (2 g) of the air core coils 104(1) and 104(2). As a result, a database as shown in a table of FIG. 22 is obtained. In this experiment, the winding number of the air core coils 104(1) and 104(2) used in this experiment is 31 t (turns). Thus, in the last ($16^{th}$) experiment operation, an inspection block $XBL_{16}$ designed for respective single winding gap as shown in FIG. 18A and FIG. 18B, which satisfies the condition of p−<ps (g−<gs) only in the last one (No. 31) winding gap, is used.

As shown in FIG. 22, it is found that each of the $N^{th}$ resonance frequencies $f_{NP}/f_{SP}$ can be left-shifted and right-shifted. Further, it is also found that one or multiple effective zones A and non-effective zones B exist separately.

By way of example, as for fourth parallel and/or serial resonance frequencies $f_{4P}/f_{4S}$, four zones [No. 1~No. 4], [No. 9~No. 14], [No. 19~No. 22] and [No. 29~No. 31] separately distributed on the air core coils 104(1) and 104(2) serve as effective zones $A_{4L}$ for the left-shift control of shifting the resonance frequencies $f_{4P}/f_{4S}$ to a negative direction, i.e., to a lower frequency range. That is, by inserting the first comb teeth M− in certain positions within each zone, the resonance frequencies $f_{4P}/f_{4S}$ can be left-shifted. In this case, the other three zones [No. 5~No. 8], [No. 15~No. 18] and [No. 23~No. 28] between the four effective zones $A_{4L}$ are non-effective zones $B_{4L}$.

On the contrary, for the right-shift control for the fourth resonance frequencies $f_{4P}/f_{4S}$, the three separate zones [No. 5~No. 8], [No. 15~No. 18] and [No. 23~No. 28] serve as effective zones $A_{4R}$ for the right-shift control of shifting the resonance frequencies $f_{4P}/f_{4S}$ to a positive direction, i.e., to a higher frequency range. That is, by inserting the first comb teeth M− in winding gaps at certain positions in these zones, the resonance frequencies $f_{4P}/f_{4S}$ can be right-shifted. In this case, the other four zones [No. 1~No. 4], [No. 9~No. 14], [No. 19~No. 22] and [No. 29~No. 31] are non-effective zones $B_{4R}$.

As stated above, the distribution patterns of the effective zones $A_{4L}$ and $A_{4R}$ determined from the database of FIG. 22 for the left-shift control and the right-shift control of the fourth resonance frequencies $f_{4P}/f_{4S}$ are similar to those shown in FIG. 14B and FIG. 15B, respectively.

Likewise, distribution patterns of effective zones $A_{1L}$ and $A_{1R}$ determined from the database of FIG. 22 for the left-shift control and the right-shift control of a first parallel resonance frequencies $f_{1P}$ are similar to those shown in FIG. 8B and FIG. 9B, respectively. Further, distribution patterns of effective zones $A_{2L}$ and $A_{2R}$ determined from the database of FIG. 22 for the left-shift control and the right-shift control of second parallel and/or serial resonance frequencies $f_{2P}/f_{2S}$ are similar to those shown in FIG. 10B and FIG. 11B, respectively. In addition, distribution patterns of effective zones $A_{3L}$ and $A_{3R}$ determined from the database of FIG. 22 for the left-shift control and the right-shift control of third parallel and/or serial resonance frequencies $f_{3P}/f_{3S}$ are similar to those shown in FIG. 12B and FIG. 13B, respectively. Further, distribution patterns of effective zones $A_{4L}$ and $A_{4R}$ determined from the database of FIG. 22 for the left-shift control and the right-shift control of the fourth parallel and/or serial resonance frequencies $f_{4P}/f_{4S}$ are similar to those shown in FIG. 14B and FIG. 15B, respectively.

Further, in order to obtain a maximum left-shift amount or a maximum right shift amount for each of the $N^{th}$ parallel and/or serial resonance frequencies $f_{NP}/f_{NS}$, the present inventors have also conducted an experiment in which the first comb teeth M− are inserted in all winding gaps g within all effective zones $A_{NL}$ and $A_{NR}$ and the second comb teeth M+ are inserted in all winding gaps g within all non-effective zones $B_{NL}$ and $B_{NR}$, and a frequency-impedance characteristic of one filter 102(1) is acquired by the impedance analyzer. Then, for the left-shift amount and the right-shift amount of each of the $N^{th}$ parallel resonance frequency $f_{NP}$, an estimated value (sum value) $\delta f_{NP}$ obtained from the database (FIG. 22) based on the principle of overlapping and an actual measurement value $\Delta f_{NP}$ obtained from a measurement value of the frequency-impedance characteristic are compared. As a result, no significant difference between the estimated value (sum value) $\delta f_{NP}$ and the actual measurement value $\Delta f_{NP}$ is observed in both cases of the left-shift control and the right-shift control of the $N^{th}$ parallel resonance frequency $f_{NP}$.

Figure 23A:
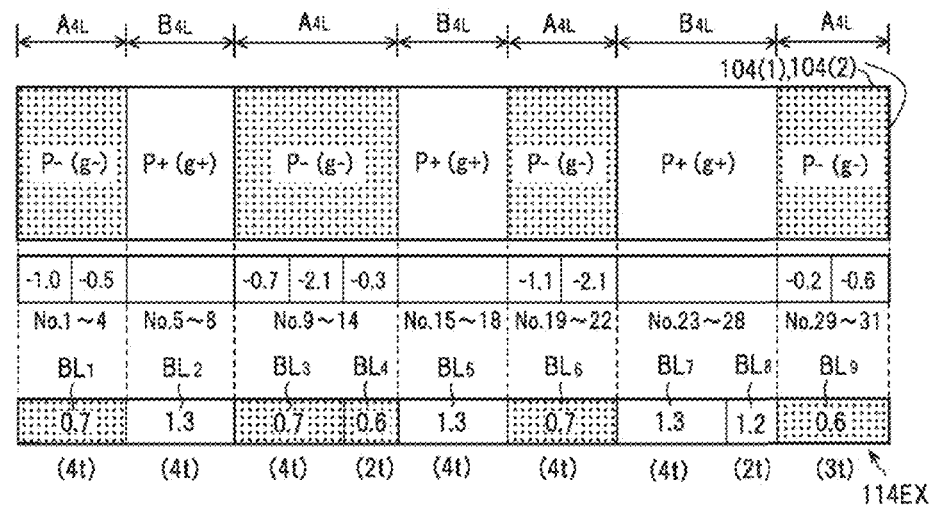
FIG. 23A is a diagram showing a comb teeth arrangement pattern set to maximize a left-shift amount for the fourth resonance frequency in the above experimental example.
Figure 23B:
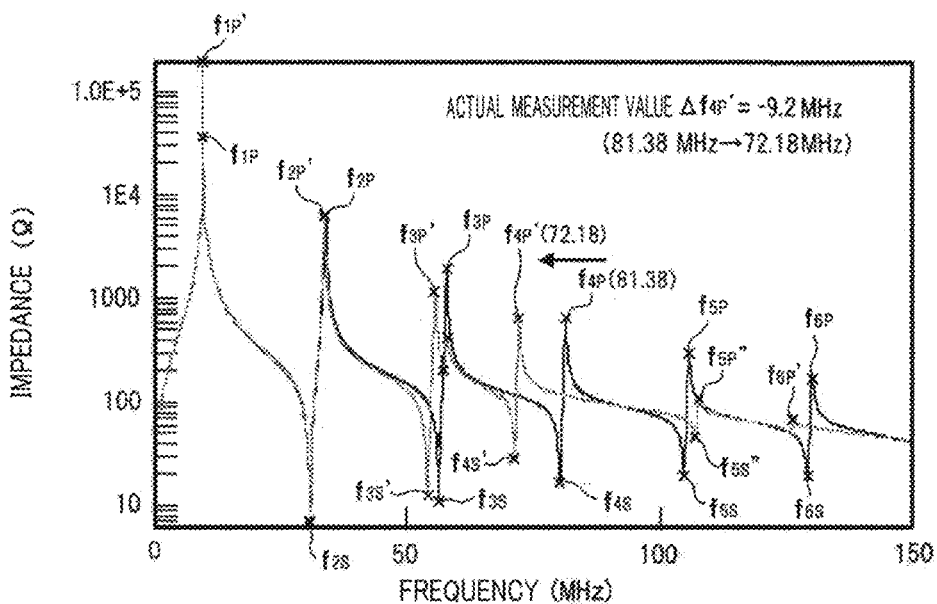
FIG. 23B is a diagram showing a frequency-impedance characteristic of a filter in which a comb-teeth member having the comb teeth arrangement pattern of FIG. 23A is coupled to the air core coil, in comparison with a comparison reference frequency-impedance characteristic (standard characteristic)

As an example, FIG. 23A illustrates a block assembly structure $BL_1$ to $BL_9$ and an arrangement pattern of comb teeth M (M− and M+) of a comb-teeth member 114EX used in an experiment in which a left-shift amount of a fourth parallel resonance frequency $f_{4P}$ can be maximized. FIG. 23B shows a frequency-impedance characteristic of the filter 102(1) in which the comb-teeth member 114EX is connected to air core coils 104(1) and 104(2).

As depicted in FIG. 23A, in this experiment, among the winding gaps of 31 t(turn) (No. 1 to No. 31) of the air core coils 104(1) and 104(2), first comb teeth M− having a thickness t− of 0.7 mm are inserted in the $1^{st}$ to $4^{th}$ winding gaps (No. 1 to No. 4 (effective zone $A_{4L}$)); second comb teeth M+ having a thickness t+ of 1.3 mm are inserted in the $5^{th}$ to $8^{th}$ winding gaps (No. 5 to No. 8 (non-effective zone $B_{4L}$)); first comb teeth M− having a thickness t− of 0.7 mm or 0.6 mm are inserted in the $9^{th}$ to $14^{th}$ winding gaps (No. 9 to No. 14 (effective zone $A_{4L}$)); second comb teeth M+ having a thickness t+ of 1.3 mm are inserted the $15^{th}$ to $18^{th}$ winding gaps (No. 15 to No. 18 (non-effective zone $B_{4L}$)); first comb teeth M− having a thickness t− of 0.7 mm are inserted in the $19^{th}$ to $22^{th}$ winding gaps (No. 19 to No. 22 (effective zone $A_{4L}$)); second comb teeth M+ having a thickness t+ of 1.3 mm or 1.2 mm are inserted the $23^{th}$ to $28^{th}$ winding gaps (No. 23 to No. 28 (non-effective zone $B_{4L}$));

and first comb teeth M− having a thickness t− of 0.6 mm are inserted in the $29^{th}$ to $31^{th}$ winding gaps (No. 29 to No. 31 (effective zone $A_{4L}$)).

In this case, referring to the above-described database (FIG. 22), a sum value of all left-shift amounts on the unit of every two winding gaps within the four zones [No. 1~No. 4], [No. 9~No. 14], [No. 19~No. 22] and [No. 29~No. 31] as effective zones $A_{4L}$, i.e., an estimated value $\delta f_{4P}'$ is as follows:

$f_{4P}' = -(1.0+0.5+0.7+2.1+0.3+1.1+2.1+0.2+0.6)$ MHz=−8.6 MHz

Meanwhile, as shown in FIG. 23B, in the frequency-impedance characteristic of the filter 102(1) in which the comb-teeth member 114EX ($BL_1$~$BL_9$) of FIG. 23B is coupled to the air core coils 104(1) and 104(2), the fourth parallel resonance frequency $f_{4P}$ is changed from a standard value of 81.38 MHz to 72.18 MHz. That is, an actual measurement value $\Delta f_{4P}'$ of the left-shift amount is as follows.

$\Delta f_{4P}' = (72.18-81.38)$MHz=−9.2 MHz

As can be seen from this, there is no significant difference between the estimated value $\delta f_{4P}'$(−8.6 MHz) and the actual measurement value $\Delta f_{4P}'$(−9.2 MHz).

Figure 24A:
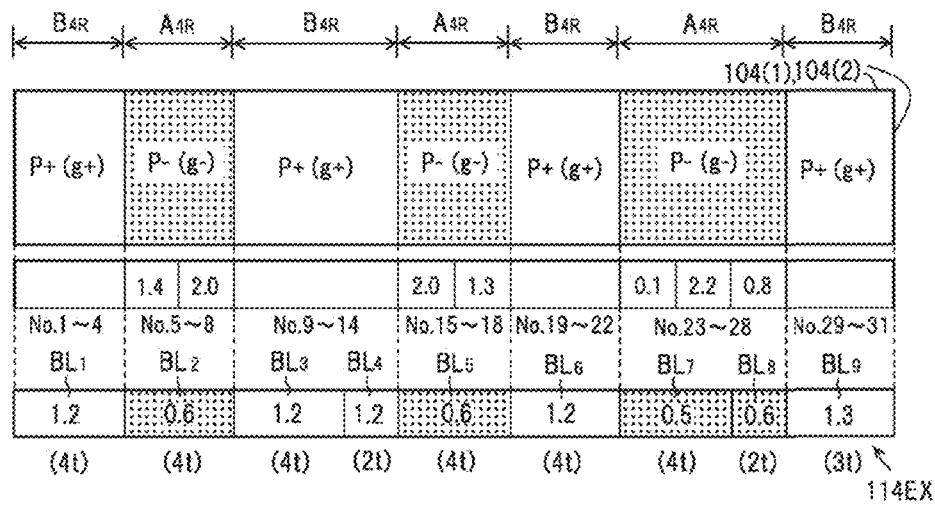
FIG. 24A is a diagram showing a comb teeth arrangement pattern set to maximize a right-shift amount for the fourth resonance frequency in the above experimental example.
Figure 24B:
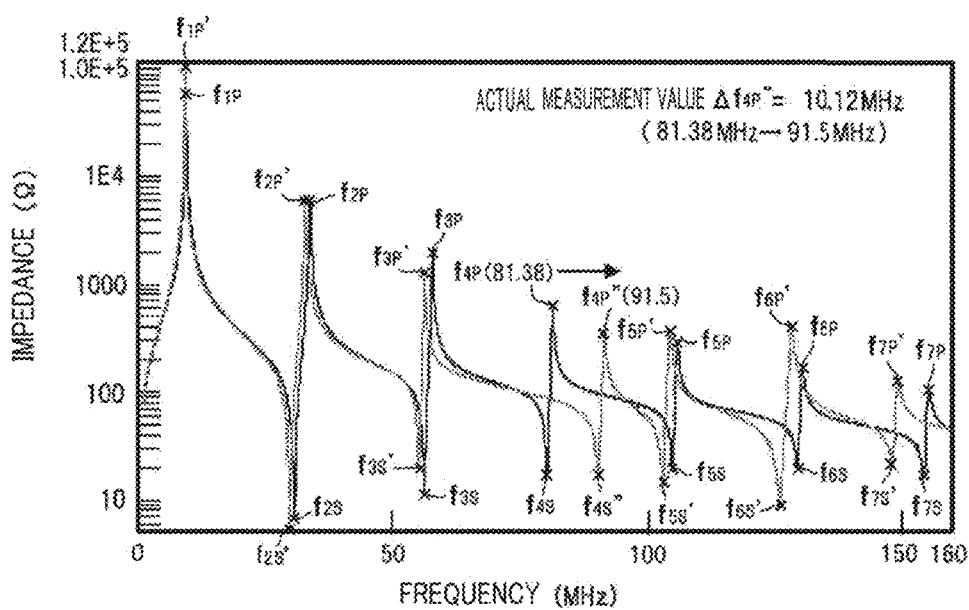
FIG. 24B is a diagram showing a frequency-impedance characteristic of a filter in which a comb-teeth member having the comb teeth arrangement pattern of FIG. 24A is coupled to the air core coil, in comparison with a comparison reference frequency-impedance characteristic (standard characteristic)

As another example, FIG. 24A shows an arrangement pattern of a block assembly structure $BL_1$ to $BL_9$ and comb teeth M (M−, M+) of a comb-teeth member 114EX used in an experiment in which a right-shift amount of the fourth parallel resonance frequency $f_{4P}$ can be maximized, and FIG. 24B shows a frequency-impedance characteristic of the filter 102(1) in which the comb-teeth member 114EX is coupled to the air core coils 104(1) and 104(2).

As shown in FIG. 24A, in this experiment, among the winding gaps of 31 t (turns) (No. 1 to No. 31) of the air core coils 104(1) and 104(2), second comb teeth M+ having a thickness t+ of 1.2 mm are inserted in $1^{st}$ to $4^{th}$ winding gaps (No. 1 to No. 4 (non-effective zone $B_{4R}$)); first comb teeth M− having a thickness t− of 0.6 mm are inserted in the $5^{th}$ to $8^{th}$ winding gaps (No. 5 to No. 8 (effective zone $A_{4R}$); second comb teeth M+ having a thickness t+ of 1.2 mm are inserted in the $9^{th}$ to $14^{th}$ winding gaps (No. 9 to No. 14 (non-effective zone $B_{4R}$)); first comb teeth M− having a thickness t− of 0.6 mm are inserted the $15^{th}$ to $18^{th}$ winding gaps (No. 15 to No. 18 (effective zone $A_{4R}$)); second comb teeth M+ having a thickness t+ of 1.2 mm are inserted in the $19^{th}$ to $22^{th}$ winding gaps (No. 19 to No. 22 (non-effective zone $B_{4R}$)); first comb teeth M− having a thickness t− of 0.5 mm or 0.6 mm are inserted the $23^{th}$ to $28^{th}$ winding gaps (No. 23 to No. 28 (effective zone $A_{4R}$)); and second comb teeth M+ having a thickness t+ of 1.3 mm are inserted in the $29^{th}$ to $31^{th}$ winding gaps (No. 29 to No. 31 (non-effective zone $B_{4R}$)).

In this case, referring to the above-described database (FIG. 22), a sum value of all right-shift amounts on the unit of every two winding gaps within the three zones [No. 5~No. 8], [No. 15~No. 18] and [No. 23~No. 28] as effective zones $A_{4R}$, i.e., an estimated value $\delta f_{4P}''$ is as follows.

$f_{4P}'' = (1.4+2.0+2.0+1.3+0.1+2.2+0.8)$MHz=9.8 MHz

Meanwhile, as shown in FIG. 24B, in the frequency-impedance characteristic of the filter 102(1) in which the comb-teeth member 114EX ($BL_1$~$BL_9$) of FIG. 24B is coupled to the air core coils 104(1) and 104(2), the fourth parallel resonance frequency $f_{4P}$ is changed from a standard value of 81.38 MHz to 91.5 MHz. That is, an actual measurement value $\Delta f_{4P}''$ of the right-shift amounts is as follows.

$\Delta f_{4P}'' = (91.5-81.38)$MHz=10.12 MHz

As can be seen from this, there is no significant difference between the estimated value $\delta f_{4P}''$ (9.8 MHz) and the actual measurement value $\Delta f_{4P}''$ (10.12 MHz).

In addition, as a case of performing independent shift controls for different resonance frequencies at the same time, there is performed a verification experiment in which the right-shift control of the second parallel resonance frequency $f_{2P}$ and the left-shift control of the fourth parallel resonance frequency $f_{4P}$ are conducted at the same time.

As shown in FIG. 25A, in this experiment, among the winding gaps of 31 t (turns) (No. 1 to No. 31) of the air core coils 104(1) and 104(2), second comb teeth M+ having a thickness t+ of 1.3 mm are inserted in $1^{st}$ to $8^{th}$ winding gaps (No. 1 to No. 8 (non-effective zone $B_{2R/4L}$)); first comb teeth M− having a thickness t− of 0.7 mm are inserted in the $9^{th}$ to $22^{th}$ winding gaps (No. 9 to No. 22 (effective zone $A_{2R/4L}$)); and second comb teeth M+ having a thickness t+ of 1.3 mm or 1 mm are inserted in the $23^{th}$ to $31^{th}$ winding gaps (No. 23 to No. 31 (non-effective zone $B_{2R/4L}$)).

In this case, referring to the above-described database (FIG. 22), a sum value of all right-shift amounts of $f_{2P}$ and a sum of all left-shift amounts of $f_{4P}$ on the unit of every two winding gaps within a single zone [No. 9~No. 22] as an effective zone $A_{2R/4L}$, i.e., estimated values $\delta f_{2P}''$, $\delta f_{4P}'$ are follows.

$\delta f_{2P}'' = (-0.1)+0.2+0.0+0.7+0.8+0.7+0.5$ MHz=2.8 MHz $\delta f_{4P}' = (-0.7)+(-2.1)+(-0.3)+2.0+1.3+(-1.1)+(-2.1)$ MHz=−3.0 MHz Meanwhile, as shown in FIG. 25B, in the frequency-impedance characteristic of the filter 102(1) in which the comb-teeth member 114EX ($BL_1$~$BL_9$) of FIG. 25B is coupled to the air core coils 104(1) and 104(2), the second parallel resonance frequency $f_{2P}$ is changed from a standard value of 33.98 MHz to 36.78 MHz, and the fourth parallel resonance frequency $f_{4P}$ is changed from a standard value of 81.38 MHz to 78.28 MHz. That is, an actual measurement value $\Delta f_{2P}''$ of the right-shift amount of the second parallel resonance frequency $f_{2P}$ and an actual measurement value $\Delta f_{4P}'$ of the left-shift amount of the fourth parallel resonance frequency $f_{4P}$ are as follows.

$\Delta f_{2P}'' = (36.78-33.98)$MHz=2.8 MHz $\Delta f_{4P}' = (78.28-81.38)$MHz=−3.1 MHz As can be seen from this, there is no difference between the estimated value $\delta f_{2P}''$ (2.8 MHz) and the actual measurement value $\Delta f_{2P}''$ (2.8 MHz) in the right-shift control of the second parallel resonance frequency $f_{2P}$, and also, there is no substantial difference between the estimated value $\delta f_{4P}'$ (−3.0 MHz) and the actual measurement value $\Delta f_{4P}'$ (−3.1 MHz) in the left-shift control of the fourth parallel resonance frequency $f_{4P}$.

In addition, in the plasma processing apparatus of the present example embodiment, when a frequency of the first frequency HF for plasma generation is 80 MHz, for example, the fourth parallel resonance frequency $f_{4P}$ needs to be adjusted to a value slightly smaller than 80 MHz (about 79 MHz) through the left-shift control. Meanwhile, when the frequency of the first high frequency power HF is 60 MHz, the third parallel resonance frequency $f_{3P}$ needs to be adjusted to a value slightly smaller than 60 MHz (about 59 MHz) through the left-shift control. Likewise, for a frequency of the second high frequency power LF for ion attraction, it is also possible to adjust the first parallel resonance frequency $f_{1P}$ to an optimum value through the left-shift control or the right-shift control. In addition, for a harmonic wave of the first high frequency power HF or the second high frequency power LF, it is possible to adjust any high-order parallel resonance frequency $f_{NP}$ to an optimum value through the left-shift control or the right-shift control.

As stated above, based on the above-described database (FIG. 22), by selecting the number and/or the combination of winding gaps g into which the first comb teeth M− are to be inserted within an effective zone A for a preset one or a multiple number of $N^{th}$ resonance frequencies, the shift direction and a shift amount of each of the $N^{th}$ resonance frequencies can be increased or decreased or controlled within a certain range (equal to or less than the maximum value).

From a different view point, by providing the comb-teeth member 114, in which the first comb teeth M− and the second comb-teeth M+ coexist in a certain distribution pattern, to the air core coils 104(1) and 104(2) as actual products, reproducibility, by which preset one $N^{th}$ resonance frequency or a multiple number of $N^{th}$ resonance frequencies necessarily appear near a set value, is high. As a result, a desired frequency-impedance characteristic or a filter characteristic having no object difference can be obtained. In the plasma processing apparatus of the present example embodiment, by using the comb-teeth member 114 having the above-described configuration, it is possible to endure or compensate the object difference or the difference in fabricating the air core coils 104(1) and 104(2), and it is also possible to easily achieve simplification, high precision and reliability of filter design in which multiple parallel resonances are matched with the frequencies of both high frequency powers HF and LF at the same time.

In addition, since the air gaps are formed in spaces between the air core coils 104(1) and 104(2) except where the comb teeth M are inserted, the heating amount from the coils is rapidly transferred through the air gap. Accordingly, the air core coils 104(1) and 104(2) can be efficiently cooled by the comb-teeth member 114.

In addition, since the filter unit 54(IN) of the present example embodiment does not have a ring member between the air core coils 104(1) and 104(2) and the external conductor 110, the high frequency noise introduced into the filter unit 54(IN) does not flow to the ground by bypassing an outside in a radial direction, i.e., the external conductor 110 on the way down the air core coils 104(1) and 104(2). Accordingly, the impedance function or the withstanding voltage characteristic against the high frequency noise is not deteriorated.

Other Example Embodiments or Modification Examples

In the above-described example embodiment, the shift amount of the left-shift control or the right-shift control for a preset $N^{th}$ resonance frequency depends on a profile in which the comb teeth M− having a thickness t− smaller than a standard thickness ts among the comb teeth M of the comb-teeth member 114 mounted to the air core coils 104(1) and 104(2) are distributed as the first comb teeth within an effective zone A. In this case, the comb teeth M+ having a thickness equal to or larger than the standard thickness ts are arranged as the second comb teeth mostly within an non-effective zone B.

However, as can be easily understood, the same effect as that obtained in the above-described example embodiment can also be obtained even when two types of the comb teeth, i.e., the comb teeth M+' having a thickness larger than the standard thickness ts and the comb teeth M−' having a thickness equal to or smaller than the standard thickness ts are arranged as the comb teeth M of the comb-teeth member 114 provided to the air core coils 104(1) and 104(2). In this case, the shift amount of the left-shift control or the right-shift control for a preset $N^{th}$ resonance frequency depends on a profile in which the comb teeth M+' having the relatively large thickness t+' are distributed as the first comb teeth within the effective zone A. In addition, the comb teeth M−' having the relatively small thickness t−' are mainly distributed as the second comb teeth within the non-effective zone B.

Figure 26:
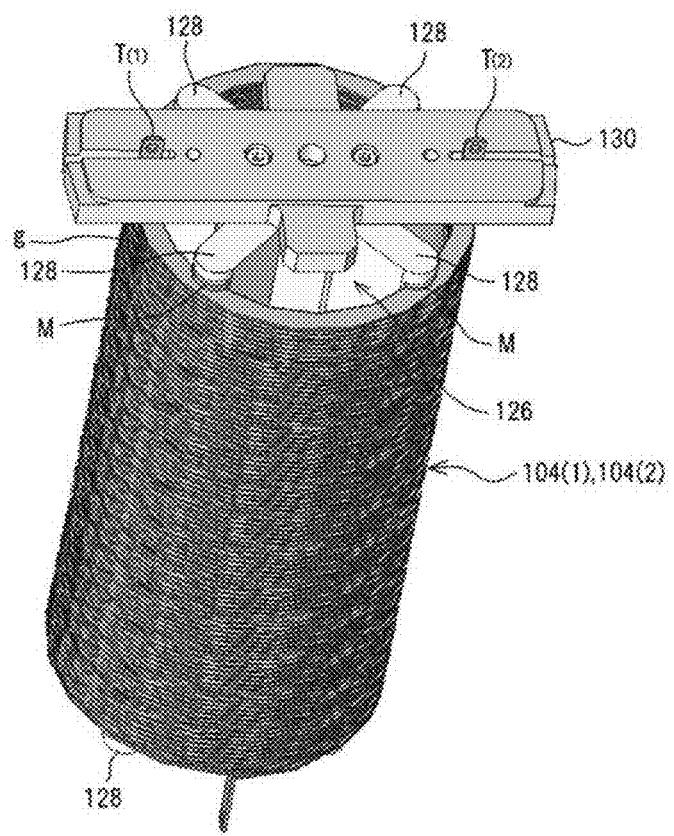
FIG. 26 is a perspective view illustrating a modification example of a specific configuration of the sub-assembly.

FIG. 26 illustrates a sub-assembly structure in the vicinity of the air core coils 104(1) and 104(2) in accordance with one modification example. In this modification example, comb teeth M (M−, M+) are formed on outer end surfaces of plate-shaped members 128 forming the coil supporting member 126, and the comb teeth M (M−, M+) of the plate-shaped member 128 are fitted into winding gaps g of each of the air core coils 104(1) and 104(2) from inside in a radial direction thereof. In this case, since the plate-shaped member 128 forming the coil supporting member 126 also serves as a comb-teeth member, the above-described rod-shaped comb-teeth member 114 need not be provided in the vicinity of the air core coils 104(1) and 104(2). In addition, in FIG. 26, the plate-shape member 130 holding the coil supporting member 126 and the filter terminals T1 and T2 serves as a jig used when assembling this sub-assembly.

As another modification example, it is possible to adopt a configuration in which comb teeth M (M−, M+) are formed on the outer end surface of the plate-shaped member 128 positioned at the inside of the air core coils 104(1) and 104(2) as shown in FIG. 26, and the rod-shaped comb-teeth member 114 having comb teeth M (M−, M+) formed on an inner surface thereof as shown in FIG. 6 is provided in the vicinity of the air core coils 104(1) and 104(2). With this configuration, the comb teeth M (M−, M+) can be inserted into the winding gaps g of the air core coils 104(1) and 104(2) from both the inside and the outside of the coils in the radial direction thereof at different positions in the circumferential direction. In addition, as still another modification example, it is also possible to adopt a configuration in which a multiple number of rod-shaped comb-teeth members 114 are provided at the inside of the air core coils 104(1) and 104(2) and comb teeth M (M−, M+) formed on an outer surface of each comb-teeth member 114 are inserted into the winding gap g of the coil 104(1) and 104(2).

In the above-described example embodiment, within the single external conductor 110, the coil conductors forming the air core coil 104(1) of the first filter 102(1) and the air core coil 104(2) of the second filter 102(2) are spirally wound while being overlapped. In this coil structure, self-inductance between the air core coils 104(1) and 104(2) are the same, and maximum mutual inductance can be obtained. As a result, a RF power loss in the filter unit 54(IN) is reduced, and the RF power loss is reduced. However, though not illustrated, it is also possible to adopt a configuration in which the air core coil 104(1) of the first filter 102(1) and the air core coil 104(2) of the second filter 102(2) are accommodated in separate external conductors 110, respectively. In addition, when the comb-teeth member 114 is provided to a single air core coil 104, relationships of $g=t_i$ and $p=g+k=t_i+k$ are established between a winding gap g at each position of the air core coil 104, a winding pitch p, a thickness $t_i$ of a comb tooth $M_i$ and a gap width k of a slit K.

In the above-described example embodiment, the left-shift control or the right-shift control is performed for one resonance frequency or a multiple number of resonance frequencies, by mounting the comb-teeth member 114 having the comb teeth M (M−, M+) configured as described above to the air core coils 104(1) and 104(2) of the filters 102(1) and 102(2) having a frequency-impedance characteristic of multiple parallel resonance.

However, the example embodiments are not limited to the filter for the power feed line such as the heater feed line and may be applicable to various filters or transmission circuits provided on a pair of lines or a single line configured to electrically connect a certain electrical member within a chamber and an external circuit of a power meter or a signal meter provided outside the chamber to each other.

Particularly, in the plasma processing apparatus of the example embodiment, by mounting the comb-teeth member 114 having the same comb teeth M (M−, M+) as described above to any other coil in which a resonance frequency is required to be controlled, the left-shift control or the right-shift control of the resonance frequency can be performed.

Figure 27:
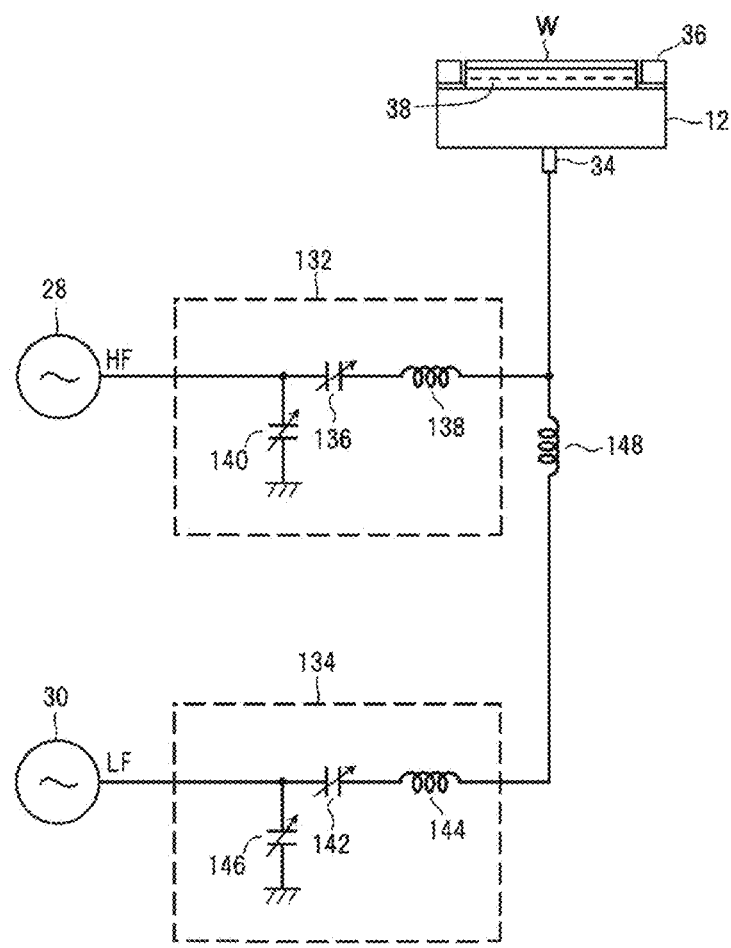
FIG. 27 is a diagram illustrating a configuration of a matching circuit in the plasma processing apparatus.

For example, as illustrated in FIG. 27, the matching circuits 132 and 134 within the matching unit 32 are provided on the high frequency power feed line between the high frequency power supplies 28, 30 and the susceptor 12 within the chamber 10, respectively. By way of example, the first matching circuit 132 for the first high frequency power HF is configured as a L-shaped matching circuit formed of a capacitor 136 and a coil 138 which are connected in series between an output terminal of the first high frequency power supply 28 and a load; and a capacitor 140 connected between an input terminal of the capacitor 136 and a ground potential member (not illustrated). In addition, the second matching circuit 134 for the high frequency power LF is also configured as a L-shaped matching circuit formed of a capacitor 142 and a coil 144 which are connected in series between an output terminal of the second high frequency power supply 30 and a load; and a capacitor 146 connected between an input terminal of the capacitor 142 and a ground potential member (not illustrated). In addition, a coil 148 configured to pass the second high frequency power LF and block the first high frequency power HF is connected between the output terminals of the two matching circuits 132 and 134.

The coils 138, 144 and 148 may be implemented by air core coils. Typically, each of the air core coils 138, 144 and 148 functions as a lumped constant element and has self-inductance. Further, since a parallel LC circuit is equivalently formed between the self-inductance and parasitic capacitance generated in the vicinity thereof, each coli has a self-resonance frequency. Accordingly, in at least one of the air core coils 138, 144 and 148, high impedance obtained near the self-resonance frequencies may be used to block an undesired high frequency power on the line, e.g., a harmonic wave.

In that case, for example, by mounting the comb-teeth member 114 equipped with the comb teeth M (M−, M+) having the above-described configuration to all of the air core coils 138, 144 and 148 used for blocking the harmonic wave and, then, by performing the left-shift control or the right-shift control for each of the self-resonance frequencies, non-uniformity or object difference in fabricating the air core coils 138, 144 and 148 can be endured or compensated, and simplification, precision and reliability of coil design in which the self-resonance frequency is required to be controlled can be easily realized.

The above-described example embodiment is directed to a filter configured to, in a capacitively coupled plasma etching apparatus of a lower electrode dual frequency application type in which the first high frequency power HF for plasma generation and the second high frequency power LF for ion attraction are applied to the susceptor 12 within the chamber 10, reduce noises of both high frequency powers on a pair of the heater power feed lines 100(1) and 100(2) electrically connecting the heating element 40 mounted in the susceptor 12 and the heater power supply 58(IN) and 58(OUT) provided outside the chamber 10. However, the filter or the filter unit of the above-described example embodiments may be properly applied to a capacitively coupled plasma etching apparatus of an upper-and-lower electrode dual frequency application type configured to apply the first high frequency power HF for plasma generation to an upper electrode 64 while applying the second high frequency power LF for ion attraction to the susceptor 12, or a capacitively coupled plasma etching apparatus of a lower electrode single frequency application type configured to apply a single high frequency power to the susceptor 12.

The present example embodiment may not be limited to the capacitively coupled plasma etching apparatus but can be applied to various types of plasma etching apparatuses such as a microwave plasma etching apparatus, an inductively coupled plasma etching apparatus, a helicon wave plasma etching apparatus, etc. and, also, can be applied to other plasma processing apparatuses such as a plasma CVD apparatus, a plasma oxidizing apparatus, a plasma nitriding apparatus, a sputtering apparatus, etc. Further, the processing target substrate may not be limited to the semiconductor wafer but may be a photomask, a CD substrate, a print substrate, or one of various types of substrates for a flat panel display, an organic EL and a solar cell.

Other inventive effects or modification examples may be easily conceived by those skilled in the art. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus that includes an external circuit of a power meter or a signal meter electrically connected via a line to an electrical member within a processing vessel in which a plasma process is performed, wherein the plasma processing apparatus is configured to reduce or block a noise of a predetermined frequency introduced from the electrical member into the line toward the external circuit by a filter provided on the line, wherein the filter comprises:
  an air core coil;
  a cylindrical external conductor, accommodating or surrounding the air core coil, and in combination with the air core coil, configured to form a distributed constant line in which parallel resonance of multiple frequencies corresponding to multiple parallel resonance frequencies occurs; and
  first comb teeth and second comb teeth, all of which are made of an insulating material and are selectively inserted into winding gaps of the air core coil,
  wherein each of the first comb teeth has a thickness smaller than a standard thickness, which is a comb tooth thickness that allows a uniform winding gap over an entire length of the air core coil, and wherein the first comb teeth are inserted into one or more zones that are arranged separately in a longitudinal direction of a central axis of an air core coil winding to shift one or more of the plural parallel resonance frequencies to a lower frequency range in a frequency-impedance characteristic of the filter,
wherein each of the second comb teeth has a thickness equal to or larger than the standard thickness, and
wherein the second comb teeth are inserted into the winding gaps in which the first comb teeth are not inserted, and
wherein the thickness of each of the first and the second comb teeth is measured longitudinally relative to the central axis of the air core coil winding.

2. The plasma processing apparatus of claim 1,
wherein the number of the effective zones provided for a preset $N^{th}$ resonance frequency of the parallel resonance frequencies in the air core coil is N (N is a natural number).

3. The plasma processing apparatus of claim 1,
wherein the electrical member is a heating element provided within or in a vicinity of a high frequency electrode to which a high frequency power of a preset frequency is applied in performing the plasma process,
the external circuit is a heater power supply configured to apply a power for heat generation to the heating element, and
the line is a power feed line configured to electrically connect the heater power supply and the heating element electrically.

4. A plasma processing apparatus, comprising:
an external circuit of a power meter or a signal meter electrically connected via a line to an electrical member within a processing vessel in which a plasma process is performed; and
a filter provided on the line, the filter comprising:
an air core coil that is provided on the line and has a self-resonance frequency; and
first comb teeth and second comb teeth, all of which are made of an insulating material and are selectively inserted into wining gaps of the air core coil,
wherein each of the first comb teeth has a thickness smaller than a standard thickness, which is a comb tooth thickness that allows a uniform winding gap over an entire, length of the air core coil, and wherein the first comb teeth are inserted into one or more zones that are arranged separately in a longitudinal direction of a central axis of an air core coil winding, to shift the self-resonance frequency to a lower frequency range in a frequency-impedance characteristic of the air core coil,
wherein each of the second comb teeth has a thickness equal to or larger than the standard thickness and wherein the second comb teeth are inserted into the winding gaps in which the first comb teeth are not inserted, and
wherein the thickness of the first and the second comb teeth is measured longitudinally relative to the central axis of the air core coil winding.

5. The plasma processing apparatus of claim 4,
wherein the electrical member is a high frequency electrode provided in a mounting table configured to support a processing target object,
the external circuit includes a high frequency power supply configured to apply a high frequency power for performing the plasma process to the high frequency electrode, and
a matching circuit configured to match impedance between the high frequency power supply and a plasma load on the line.

6. The plasma processing apparatus of claim 4,
wherein the comb teeth are inserted into the winding gaps of the air core coil locally at plural positions in a circumferential direction thereof.

7. The plasma processing apparatus of claim 4,
wherein the comb teeth are formed on an inner surface of a plurality of rod-shaped members composed of an insulator which are extended in parallel to the central axis of the air core coil winding and, also, arranged adjacent to an outer peripheral surface of the air core coil.

8. The plasma processing apparatus of claim 4,
wherein the comb teeth are formed on an outer surface of a plurality of rod-shaped members composed of an insulator which are extended in parallel to the central axis of the air core coil winding and, also, arranged adjacent to an inner peripheral surface of the air core coil.

9. The plasma processing apparatus of claim 7,
wherein the rod-shaped member is divided into a multiple number of blocks in the lengthwise direction of the air core coil, and one of the first comb teeth and the second comb teeth are arranged on each block at a regular distance with a gap, which has a width equal to a thickness of a coil conductor of the air core coil, therebetween.

10. The plasma processing apparatus of claim 4,
wherein the comb teeth are formed on an outer end surface of a plurality of plate-shaped members formed of an insulating member provided within the air core coil, and the insulating members are radially extended in a radial direction of the air core coil to come into contact with an inner peripheral surface of the air core coil and, also, extended in parallel to the central axis of the air core coil winding.

* * * * *